United States Patent
Breslow et al.

(10) Patent No.: US 10,749,545 B1
(45) Date of Patent: Aug. 18, 2020

(54) COMPRESSING TAGS IN SOFTWARE AND HARDWARE SEMI-SORTED CACHES

(71) Applicant: Advanced Micro Devices, Inc., Santa Clara, CA (US)

(72) Inventors: Alexander D. Breslow, San Jose, CA (US); Nuwan Jayasena, Cupertino, CA (US); John Kalamatianos, Arlington, MA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 16/557,602

(22) Filed: Aug. 30, 2019

(51) Int. Cl.
| | | |
|---|---|---|
| *H03M 7/40* | (2006.01) | |
| *H03M 7/30* | (2006.01) | |
| *G06F 16/901* | (2019.01) | |
| *G06F 16/903* | (2019.01) | |

(52) U.S. Cl.
CPC ........ *H03M 7/4037* (2013.01); *G06F 16/902* (2019.01); *G06F 16/903* (2019.01); *H03M 7/3077* (2013.01)

(58) Field of Classification Search
CPC . H03M 7/4037; H03M 7/3077; G06F 16/902; G06F 16/903
USPC ...................................................... 341/51–75
See application file for complete search history.

(56) References Cited

U.S. PATENT DOCUMENTS

| | | | | |
|---|---|---|---|---|
| 5,704,060 | A * | 12/1997 | Del Monte | H03M 7/30 |
| 6,121,903 | A * | 9/2000 | Kalkstein | H03M 7/3086 341/106 |
| 6,650,259 | B1* | 11/2003 | Cooper | H03M 7/3088 341/106 |
| 10,613,791 | B2* | 4/2020 | Meister | G06F 3/0649 |
| 2002/0057213 | A1* | 5/2002 | Heath | H03M 7/3088 341/51 |
| 2006/0153239 | A1* | 7/2006 | Julian | H04W 28/065 370/474 |
| 2009/0174583 | A1* | 7/2009 | Diaz-Gutierrez | H03M 7/40 341/65 |
| 2011/0158323 | A1* | 6/2011 | Chen | H03M 7/40 375/240.24 |
| 2015/0178305 | A1* | 6/2015 | Mueller | G06F 16/221 707/693 |
| 2016/0112062 | A1* | 4/2016 | Dalton | H03M 7/3084 341/87 |
| 2018/0356989 | A1* | 12/2018 | Meister | G06F 11/2089 |

* cited by examiner

*Primary Examiner* — Lam T Mai
(74) *Attorney, Agent, or Firm* — Polansky & Associates, P.L.L.C.; Paul J. Polansky; Nathan H. Calvert

(57) ABSTRACT

A data storage system performs partial compression and decompression of a set of memory items. The memory items each include a data block and a tag with a prefix making up at least part of the tag. The memory items are ordered based on the prefixes. A code word is created containing compressed information representing values of the prefixes for the set of memory items. The code word and block data for each of the memory items are stored in a memory. The code word is decompressed to recover the prefixes.

20 Claims, 18 Drawing Sheets

400

$l_3$    $l_2$    $l_1$    $l_0$

| Prefixes (ordered from right to left) | Output ($\sigma$) |
|---|---|
| 0,0,0,0 | $0 = \binom{0+3}{3+1} + \binom{0+2}{2+1} + \binom{0+1}{1+1} + \binom{0+0}{0+1} = 0+0+0+0$ |
| 1,0,0,0 | $1 = \binom{1+3}{4} + \binom{0+2}{3} + \binom{0+1}{2} + \binom{0+0}{1} = 1+0+0+0$ |
| 1,1,0,0 | $2 = \binom{1+3}{4} + \binom{0+2}{3} + \binom{0+1}{2} + \binom{0+0}{1} = 1+1+0+0$ |
| 1,1,1,0 | $3 = \binom{1+3}{4} + \binom{1+2}{3} + \binom{1+1}{2} + \binom{0+0}{1} = 1+1+1+0$ |
| 1,1,1,1 | $4 = \binom{1+3}{4} + \binom{1+2}{3} + \binom{1+1}{2} + \binom{1+0}{1} = 1+1+1+1$ |
| 2,0,0,0 | $5 = \binom{2+3}{3+1} + \binom{0+2}{2+1} + \binom{0+1}{1+1} + \binom{0+0}{0+1} = 5+0+0+0$ |
| 2,1,0,0 | $6 = \binom{2+3}{4} + \binom{1+2}{3} + \binom{0+1}{2} + \binom{0+0}{1} = 5+1+0+0$ |
| 2,1,1,0 | $7 = \binom{2+3}{4} + \binom{1+2}{3} + \binom{1+1}{2} + \binom{0+0}{1} = 5+1+1+0$ |
| 2,1,1,1 | $8 = \binom{2+3}{4} + \binom{1+2}{3} + \binom{1+1}{2} + \binom{1+0}{1} = 5+1+1+1$ |
| 2,2,0,0 | $9 = \binom{2+3}{4} + \binom{2+2}{3} + \binom{0+1}{2} + \binom{0+0}{1} = 5+4+0+0$ |
| 2,2,1,0 | $10 = \binom{2+3}{4} + \binom{2+2}{3} + \binom{1+1}{2} + \binom{0+0}{1} = 5+4+1+0$ |
| 2,2,1,1 | $11 = \binom{2+3}{4} + \binom{2+2}{3} + \binom{1+1}{2} + \binom{1+0}{1} = 5+4+1+1$ |
| 2,2,2,0 | $12 = \binom{2+3}{4} + \binom{2+2}{3} + \binom{2+1}{2} + \binom{0+0}{1} = 5+4+3+0$ |
| 2,2,2,1 | $13 = \binom{2+3}{4} + \binom{2+2}{3} + \binom{2+1}{2} + \binom{1+0}{1} = 5+4+3+1$ |
| 2,2,2,2 | $14 = \binom{2+3}{4} + \binom{2+2}{3} + \binom{2+1}{2} + \binom{2+0}{1} = 5+4+3+2$ |

10111
Suffix $I'_0$

| | |
|---|---|
| 000 | 0=(0+0)nCr(0+1) |
| 001 | 1=(1+0)nCr(0+1) |
| 010 | 2=(2+0)nCr(0+1) |
| 011 | 3=(3+0)nCr(0+1) |
| 100 | 4=(4+0)nCr(0+1) |
| 101 | 5=(5+0)nCr(0+1) |
| 110 | 6=(6+0)nCr(0+1) |
| 111 | 7=(7+0)nCr(0+1) |

$\sigma'_0 = 16-15 = 1$

10010
Suffix $I'_1$

| | |
|---|---|
| 000 | 0=(0+1)nCr(1+1) |
| 001 | 1=(1+1)nCr(1+1) |
| 010 | 3=(2+1)nCr(1+1) |
| 011 | 6=(3+1)nCr(1+1) |
| 100 | 10=(4+1)nCr(1+1) |
| 101 | 15=(5+1)nCr(1+1) |
| 110 | 21=(6+1)nCr(1+1) |
| 111 | 28=(7+1)nCr(1+1) |

$\sigma'_1 = 51-35 = 16$

11111
Suffix $I'_2$

| | |
|---|---|
| 000 | 0=(0+2)nCr(2+1) |
| 001 | 1=(1+2)nCr(2+1) |
| 010 | 4=(2+2)nCr(2+1) |
| 011 | 10=(3+2)nCr(2+1) |
| 100 | 20=(4+2)nCr(2+1) |
| 101 | 35=(5+2)nCr(2+1) |
| 110 | 56=(6+2)nCr(2+1) |
| 111 | 84=(7+2)nCr(2+1) |

$\sigma'_2 = 261-210 = 51$

10111
Suffix $I'_3$

| | |
|---|---|
| 000 | 0=(0+3)nCr(3+1) |
| 001 | 1=(1+3)nCr(3+1) |
| 010 | 5=(2+3)nCr(3+1) |
| 011 | 15=(3+3)nCr(3+1) |
| 100 | 35=(4+3)nCr(3+1) |
| 101 | 70=(5+3)nCr(3+1) |
| 110 | 126=(6+3)nCr(3+1) |
| 111 | 210=(7+3)nCr(3+1) |

$\sigma'_3 = 261$

COMPRESSING TAGS IN SOFTWARE AND HARDWARE SEMI-SORTED CACHES

CROSS-REFERENCE TO RELATED APPLICATIONS

This application is related to U.S. patent application Ser. No. 16/542,872 filed Aug. 16, 2019, by the same inventors, entitled "SEMI-SORTING COMPRESSION WITH ENCODING AND DECODING TABLES".

BACKGROUND

Many different compression algorithms have been proposed for compressing cache lines in caches. In general, these algorithms are suitable for compressing program data because such data is typically highly structured. For example, program data often includes large strings of repetitive data, similarly valued numbers adjacent to one another, and values that repeat across cache lines when the data is stored in a cache. Compressors implementing such compression algorithms reduce the storage space required for cache lines when they are able to replace the repetitive data with a more succinct representation.

While these compression algorithms can also be employed to compress a cache structure's tags, they often yield inconsistent compression ratios, which results in great variability in the size of the compressed tags. This variability complicates the associated hardware cache design and verification since the tag arrays need to be able to store and retrieve variable length compressed tags. By contrast, techniques that yield a consistent compression ratio are simpler to implement since there is only a single size of compressed tag. Furthermore, when dealing with caching, especially hardware-based caching, the latency of the compression algorithm often dictates the feasibility of its implementation for different levels of the cache hierarchy. Compression technology needs to operate within the latency threshold of the underlying cache so that its costs are hidden from the critical path of the processor's execution. Simpler compression techniques can be more easily implemented subject to these latency constraints and in hardware implementations typically require less power and area.

BRIEF DESCRIPTION OF THE DRAWINGS

FIG. 4 illustrates in table form a process for using encoding tables to create a code word containing compressed data according to some embodiments.

FIG. 8 illustrates in diagram form part of a process using encoding tables to decompress a code word according to some embodiments.

Figure 1:
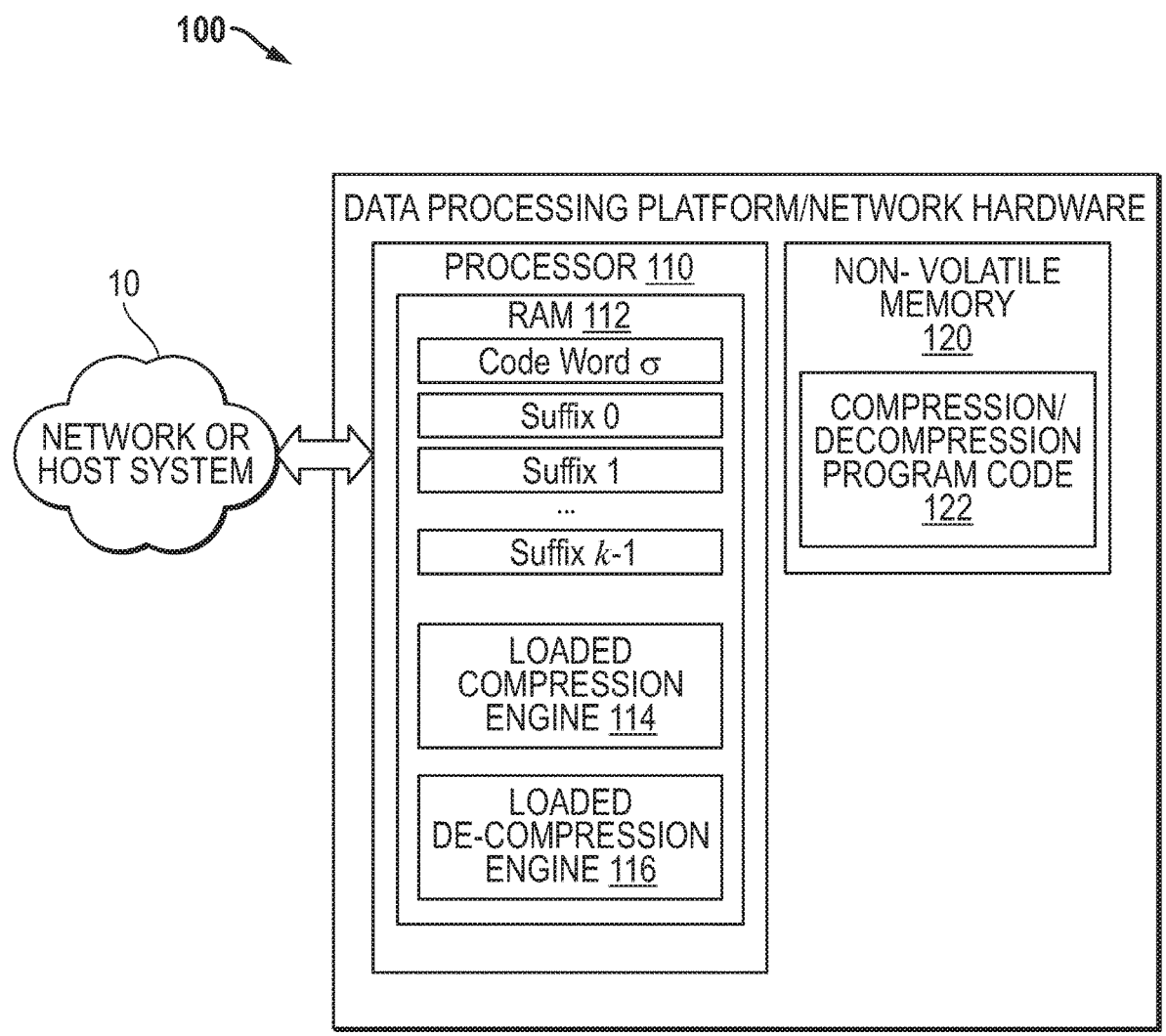
FIG. 1 illustrates in block diagram form a data processing platform including compression according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data storage and retrieval system includes a memory and a digital logic circuit coupled to the memory. The digital logic circuit receives a set of memory items, the memory items each include a data block and a tag with a prefix including at least part of the tag. The set of memory items are ordered based on their prefixes. A code word is created containing compressed information representing the values of the prefixes. The code word and the data block for each of the memory items are stored in the memory. The code word is decompressed to recover one or more of the prefixes, and at least one of the tags is provided based at least in part on a respective one of the recovered prefixes.

A method compresses and stores data. The method includes receiving a set of memory items, the memory items each including a data block and a tag with a prefix including at least part of the tag. The set of memory items are ordered based on the prefixes. A code word is created containing compressed information representing values of the prefixes. The data block for each of the memory items and the code word are stored in a tagged hardware structure.

A method decompresses stored data. The method includes retrieving a code word from a tagged hardware structure, the code word of memory items including a data block for each memory item and a code word containing compressed information representing values of prefixes for each of a set of memory items, the memory items including data blocks stored in a sorted order according to the prefixes. The code word is decompressed to obtain the prefixes for each memory item in the sorted order. Based on the prefixes, a respective tag is provided for each of the data items, each prefix including at least part of the respective tag.

FIG. 1 illustrates in block diagram form a data processing platform including compression according to some embodiments. Data processing platform 100 may be any platform with a need for compressing a set of data items with high entropy that may be reordered. For example, the techniques herein have many applications like compression of software and hardware cache tags and fingerprints in approximate set membership data structures. Generally, data processing platform 100 provides compression and decompression for a set of fixed-length items. The techniques are most beneficial with uniformly random items (i.e., with maximum informational entropy) whose order can be permuted. Application may vary from networking, software systems, and hardware caches.

Data processing platform 100 communicates with a network or host system 10 to fulfill requests for data storage and retrieval, or perform operations such as encryption key retrieval or caching for a host system. Data processing platform 100, in this example, includes a processor 110 in communication with random-access memory (RAM) 112, which may be internal or external to processor 110. RAM 112 may be part of an integrated cache of processor 110 or in the platform 100's main memory, for example. Processor 110 is also in communication with a non-volatile memory 120, which provides a tangible, non-transitory computer readable medium, such as Flash memory or a hard drive, that holds computer program code such as compression and decompression program code 122.

RAM 112 holds data used in the compression techniques described below, such as a code word σ, and suffix 0 to suffix k−1 (there are a number k of suffixes, each of which is associated with one of the k data items). Such data may also be stored in non-volatile memory. When program code 122 is loaded from non-volatile memory 120, compression and decompression program code are present in RAM 112 as depicted by the loaded compression engine 114 and loaded decompression engine 116. Other data used with the techniques described herein, such as the data items to be compressed and encoding tables may also be held in RAM 112 or non-volatile memory 120.

While in this embodiment, data processing platform includes a processor 110 which executes program code instructions, other embodiments may implement some or all of the compression features in hardware such as digital logic in networking application specific integrated circuits (ASICs), central processing units (CPUs), graphics processing units (GPUs), or programmable logic in filed programmable gate arrays (FPGAs).

Figure 2:
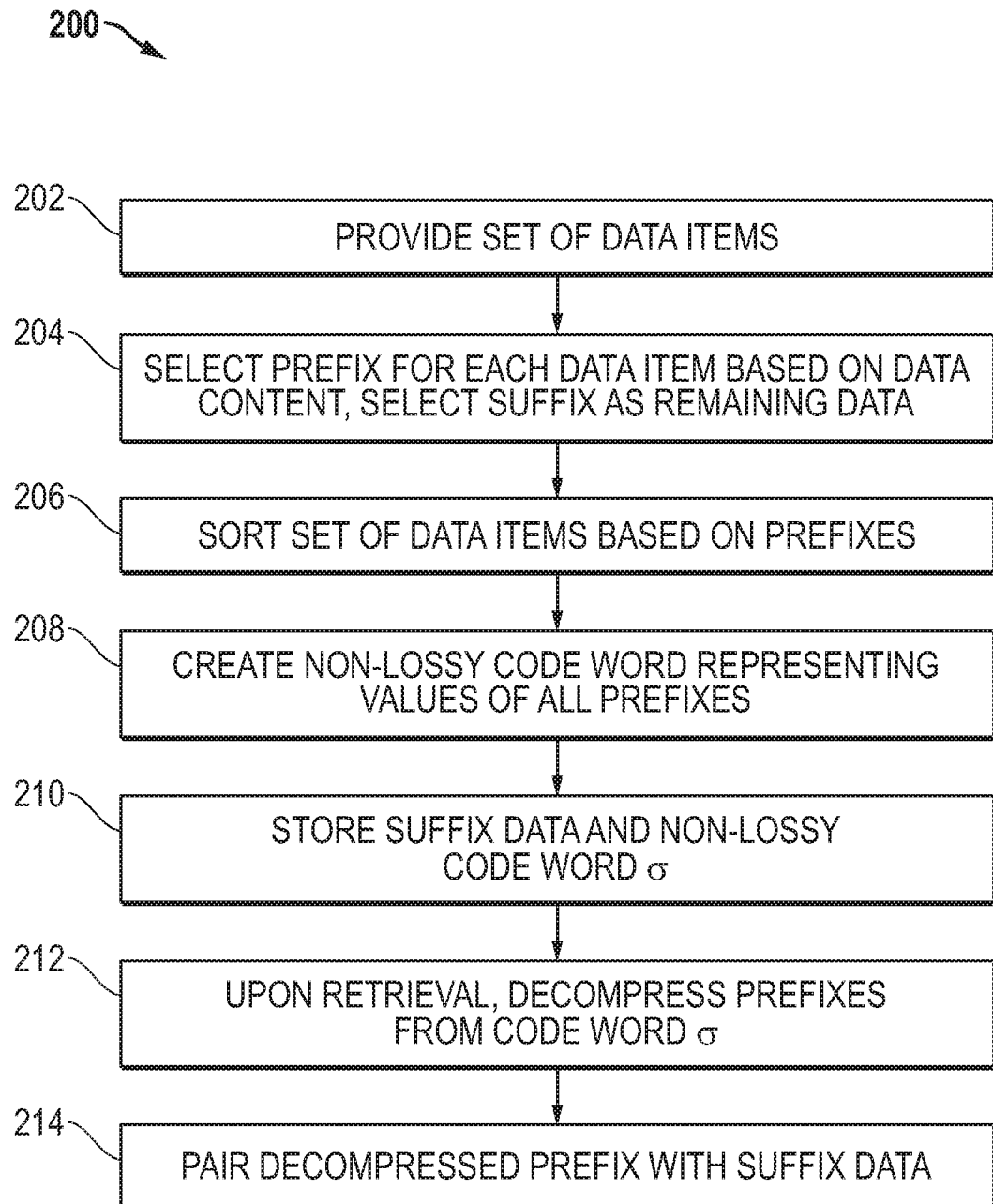
FIG. 2 illustrates in flow diagram form a process for compressing and decompressing data according to some embodiments.

FIG. 2 illustrates in flow diagram form a process 200 for compressing and decompressing data according to some embodiments. A set of data items is provided for compression at block 202. The data items are typically fixed-length items, and often have a high entropy as discussed above. Some subsequences of bits in the data items may have a high entropy, while other subsequences may be less random. For example, various types of cache lines, cache tags, fingerprints from approximate set membership data structures (ASMDSs), network routing data, hardware tables from branch predictors or hardware prefetchers, or database entries, to name some examples.

At block 204, process 200 selects a prefix and suffix data for each data item in the set based on the item's data content. In some embodiments, the data items may already have identified prefixes and suffixes, in which case block 204 is not necessary. For example, the set of data items may be a set of cache lines with cache tags already provided, of which a portion or the full tag are used as a prefix. When selecting a prefix, process 200 preferably selects a deterministic subsequence of bits from each item, such as a number of initial bits from the item. The subsequence may be selected from any desired part of the data item and may include non-sequential bits from the data item such as a fingerprint or hash that is computed from non-contiguous bit subsequences from the data item. Alternatively, a hash or computation on the desired part of the data item is used in certain implementations to select out or to produce a prefix. The suffix data is typically the bits remaining in the data item excluding the prefix.

Next, at block 206, the data items are sorted based on the prefixes. The sorting may be done on the entire set of data items, or the set may be split into subsets and the subsets sorted. In some implementations, data items are stored in order subject to an ordering of the prefixes and for these embodiments, block 206 need not be executed. Then at block 208, a code word representing compressed values of all the prefixes in the set is created, as further described below. The code word is created based on the sorted set. The code word may be non-lossy, that is, able to reproduce every bit of the compressed prefixes. If multiple subsets are sorted, a code word is typically created for each subset.

At block 210, the suffix data and the code word are stored in memory. Depending on the application, the memory used for storage may be short term RAM such as RAM 112 (FIG. 1) or storage memory such as non-volatile memory 120 (FIG. 1). The suffix data and code word may also be stored in a database or networked storage that is not part of the data processing platform performing the compression and decompression.

When information from the data set is requested, the stored suffix data and code word are retrieved, and the prefixes are decompressed at block 212. An example of one suitable decompression process is described below. The decompressed prefixes are then paired with the prefix data to provide the complete data items. In some cases, the complete code word does not need to be decompressed, if the desired data items are extracted early in the decompression process, as further described below.

Figure 3:
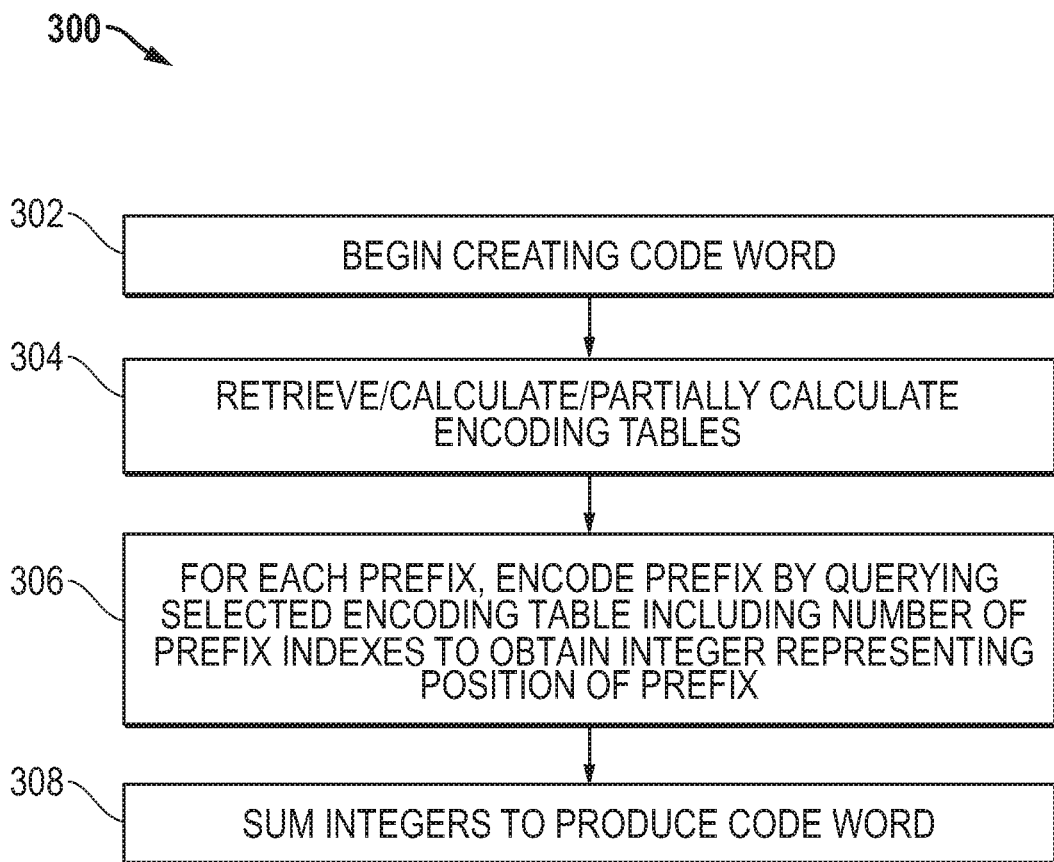
FIG. 3 illustrates in flow diagram form a more detailed process for creating a code word containing compressed data according to some embodiments.
Figure 5:
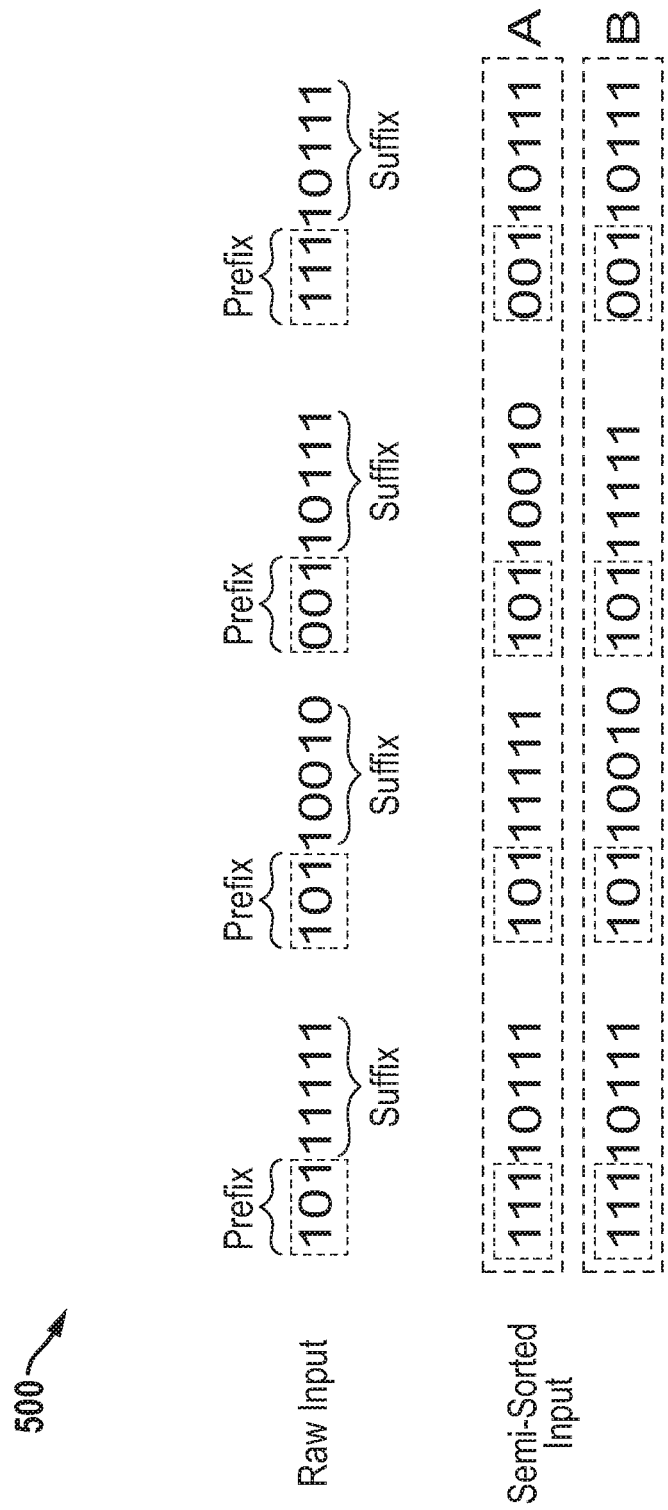
FIG. 5 is a diagram showing a semi-sorting process according to some embodiments.
Figure 6:
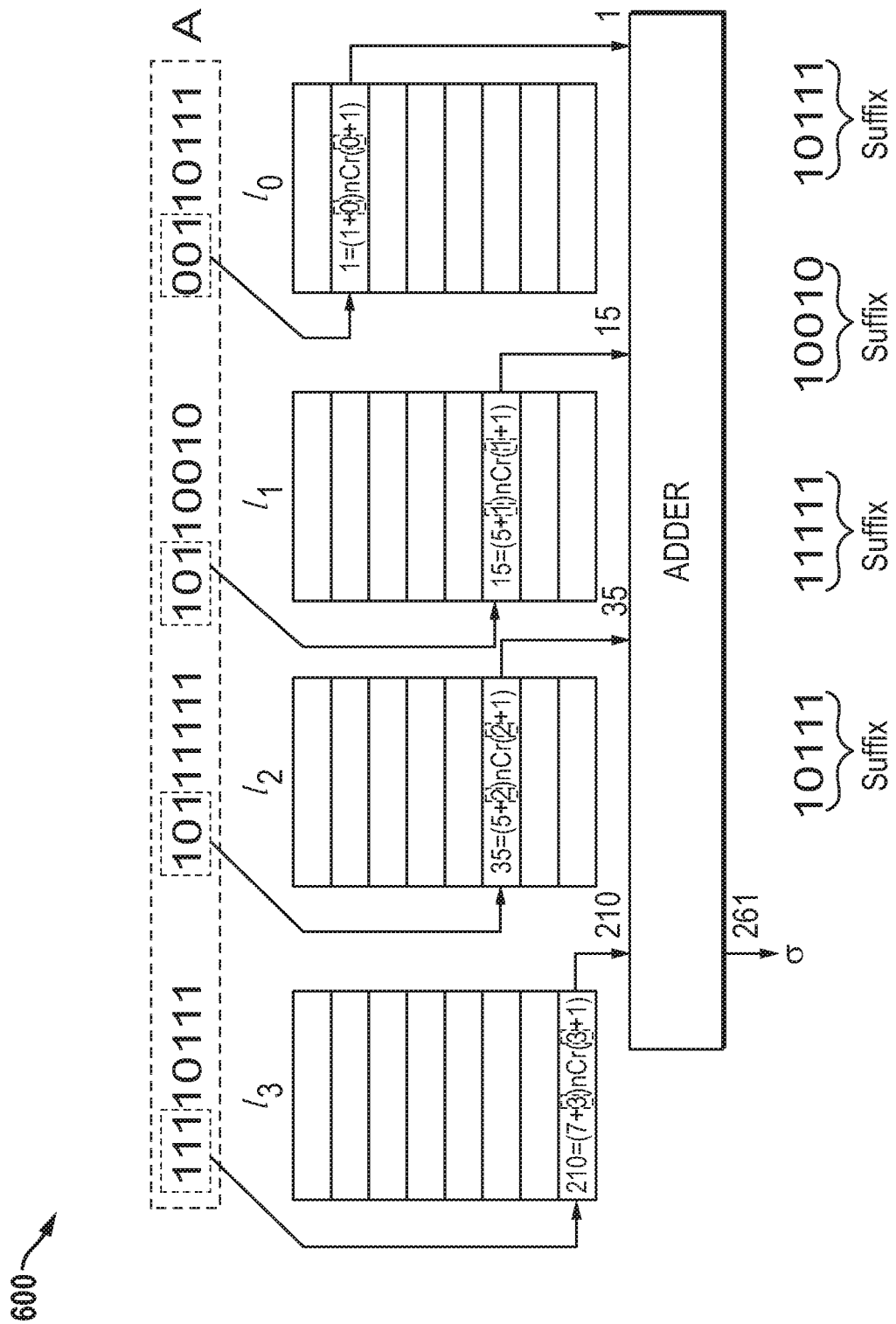
FIG. 6 is a diagram showing an example of using encoding tables to create a code word according to some embodiments.

FIG. 3 illustrates in flow diagram form a more detailed process 300 for creating a code word containing compressed data according to some embodiments. Further examples of compression processes are illustrated in FIGS. 4-6. These processes may be performed by a software compression engine such as compression engine 114 of FIG. 1, or by other suitable combinations of hardware and software.

Process 300 begins creating a code word at block 302. Block 304 provides the encoding tables needed to create the code word by either retrieving them from memory, calculating them, or partially calculating them, as further described below.

For each prefix, in the order provided by sorting, block 306 encodes the prefixes by querying multiple encoding tables to create a code word a containing compressed information representing values of all prefixes for the set of data items. In this embodiment, block 306 queries the encoding tables to obtain a plurality of integers representing respective prefix positions in the encoding tables. As depicted in FIG. 5, the process may work with variation in the sorting results, as long as the data items are ordered via their prefix values. The results of querying the multiple input tables are used to create the code word a at block 308, in this embodiment by summing the resulting integers as shown.

FIG. 5 shows the raw input of a set of data items with the prefixes and suffixes identified. The depicted data items are merely one example with a small number of small data items for simplicity, and many other arrangements of data items may be stored according to the techniques herein. These data items are sorted as set forth at block 206 (FIG. 2). This sort constitutes a semi-sort with respect to the data items because the suffix data is not used in the sort, only the prefix data. The results of the sort may therefore vary in order, as shown by the sort output A and B of FIG. 5, which are both valid results of a prefix-based sort on the data items. Notice that the two data items that share the same prefix (101) appear in swapped positions in A and B. More generally, data items with the same prefix may appear in any order in the output of the sort among one another without affecting the output's correctness. Process 300 is effective despite possible variations in the order of the input data such as those in FIG. 5.

Referring again to FIG. 3, while the blocks are depicted as sequential, the actual order depends on the implementation. When performed by a processor, the process may iterate through each prefix and add the integer value to a running total in each iteration. A more parallel implementation may perform encoding table lookups in parallel. When all the integers are summed at block 308, the completed sum provides the code word a.

FIG. 4 illustrates in table form a process for using encoding tables to create a code word containing compressed data according to some embodiments. The compression encoding takes an ordered list of k, r-bit prefixes and outputs a codeword that expresses them. Integer k represents the number of data items in the set, and r represents the number of bits in each prefix. One such encoding scheme is depicted, which uses a variant of the combinatorial expression $$\binom{2^r + k - 1}{k}$$

to enumerate the encodings. The scheme uses an iterator i that enumerates through the data items in a set 0, 1, 2, ..., k-2, k-1. As it enumerates, it plugs in the value of the prefix for the ith data item (referred to as $p_i$) in lieu of $2^r$ and i+1 in lieu of k (would be i in lieu of k were it not for zero indexing). It then sums over these partial expressions to produce a net sum. The formula for the code word a that encodes the k prefixes in this embodiment is given by equation 1:

$$\sigma = \sum_{i=1}^{k-1} \binom{p_i + i}{i+1} \quad (1)$$

The depicted table 400 shows an example of an application of this formula that follows for k=4 and r=log$_2$(3). In this example, the process takes 4 data item prefixes and reduces their storage cost from 4 log$_2$(3) 6.34 bits to log$_2$(15)≈3.91 bits. This encoding can be done by accessing one or more precomputed tables, by computing the closed form expressions in response to a compression or decompression request requiring the computed values, or by a combination thereof. Yet another alternative is to only compute values or partial values as they are needed but cache the values after they are computed in an associated data or hardware structure for later use. It is also possible to reduce the multiplication calculations involved in the computation down to a series of equivalent additions, shift, and masking operations.

For versions that use precomputed encoding lookup tables, it is preferred to use a separate lookup table for each data item in the set (excluding the 0$^{th}$ data item where the encoding is the identity function). From table 400, four encoding tables $l_0$ through $l_3$ are created holding the values for the combinatorial expressions shown in each of the four columns. These same tables can then also be used for decoding as further described below.

In this embodiment, the number of tables is equal to the number of prefixes k. In other embodiments, fewer tables may be used. For example, it is possible to use implicit encoding to implement table $l_0$, as further discussed below with respect to FIG. 10. The tables are generally referred to as tables $l_0$ through $l_{k-1}$, where each $l_i$ is the encoding table for the ith data item's prefix $p_i$. Each $l_i$ holds $2^r$ entries and is indexed into by the specific $p_i$, which yields the specific encoding. Specifically, $l_i[p_i] = \binom{p_i+i}{i+1}$ for all integral values of i where 0≤i≤k-1 and all integral values of $p_i$ where 0≤$p_i$≤$2^r$-1. In this embodiment, index values representing the prefix position within the table are used to encode the prefixes. In other embodiments, other values may be used. For example, the indexed values may appear in a different order in the table from that depicted, in which case the index returned is not necessarily a prefix position.

Various techniques may be used to increase the efficiency of computing or storing the encoding tables. The encoding tables could be partially computed on the fly to reduce their storage cost. For instance, every multiply by 2 may be implemented as a shift operation, so it is more efficient to store a count of such shifts rather than the shifted values. When providing the encoding tables $l_0$ to $l_{k-1}$, if two entries within an encoding table store the same value, the process may merge the two entries into a single entry. For example, by choosing appropriate values for r and k, the process may leverage the property that $\binom{p_i+i}{i+1} = \binom{p_i+i}{p_i-1}$, or a similar property for other encoding schemes, to reduce the number of entries per table that need to be stored (e.g., $p_i$=5 and i=2, then $\binom{5+2}{2+1} = \binom{5+2}{5-1}$, as both are 35). In that case, the process may replace the individual $l_i$'s with a single matrix that is indexed by the tuple $p_i$ and i, which does not store duplicate values for when i+1 is equal to $p_i$-1 (e.g., the process does not store both $\binom{7}{3}$ and $\binom{7}{4}$).

In some implementations, the encoding tables may be no more than a kilobyte in size for common values of r and k. The process need only store on the order of $2^r$k entries, so values of r in the range of about 4 to 8 may be employed while still providing the majority of the space savings and with a small area overhead for the encoding tables. The reduction in storage requirements for an exemplary embodiment in this range of r values can be seen below in FIG. 10.

The sequence of FIG. 5 and FIG. 6 illustrate an example compression process using 8-bit data items, and employing 3-bit prefixes. FIG. 5 illustrates in diagram form results 500 of a semi-sorting process according to some embodiments. Depicted are four raw input data items to the process, each with 8 bits. The 3-bit prefixes and the remaining 5-bit suffixes are identified. Two valid variations of the semi-sorted output (the output of block 206, FIG. 2, for example) are shown labelled A and B. As can be seen, two data items in the set have a prefix value of 101. Because the sort rearranges data items subject to the relative ordering of their respective prefixes, the two depicted data items with prefix 101 may be interchanged with one another in the sorted output without affecting correctness.

FIG. 6 illustrates in diagram form an exemplary process 600 of using encoding tables to create a code word according to some embodiments. The depicted scenario uses the set of data items from FIG. 5, sorted according to output A. The encoding process generally starts with k, r-bit prefixes, and encodes the prefixes to produce the code word a that is the compressed representation of the prefixes. In this scenario, k is four, and process 600 uses four encoding tables $l_3$ to $l_0$. The encoding tables may be produced according to the techniques described with respect to FIG. 4, or with other suitable techniques. The diagram shows an arrow from each prefix value to a table entry in the respective encoding table for the prefix, indicating the prefix value is used as an index into the table. The function "nCr" indicates the combinatorial expression "n choose r," the number of ways to choose r items from a group of n items if order does not matter. An integer value results at each respective entry, as described with respect to FIG. 3, block 306. The arrows out of the table entry to the adder block represent that the integer values are summed to produce the code word σ, in this example having a value of 261. This code word value is stored in memory along with the 5-bit suffix values.

In some embodiments, the encoding tables are provided such that, for each prefix, the respective prefix index provides a count based on a plurality of ordered collections of prefix values ordered by an ordering property, with the counts based on the prefix's relative position in the ordered collections. The count for each respective prefix index indicates a number of ordered collections of prefix values where each ordered collection's size is the output of a function applied to the prefix values' relative position in the ordered collections, and all prefix values in the ordered collections are less than the value of the respective prefix as computed by the ordering property. For example, in the embodiment of FIG. 6, when examining the ith prefix, where 0≤i<k, the ith prefix's encoding is retrieved by performing a table lookup on $l_i$[prefix]. The index value returned is a count of the number of length i+1 sorted lists of prefixes that numerically precede the first list containing ith prefix. For instance, if i is 3 and the prefix is 2, $l_3$[2] stores the count of the number of length 3+1 lists ordered in nonincreasing order that precede the list 2, 0, 0, 0. These are (1, 1, 1, 1), (1, 1, 1, 0), (1, 1, 0, 0), (1, 0, 0, 0), and (0, 0, 0, 0), which is 5 in total. While in this implementation, the ordering property employed with the ordered collections is nonincreasing, any suitable ordering property that places prefix values in a defined order may be used.

Figure 7:
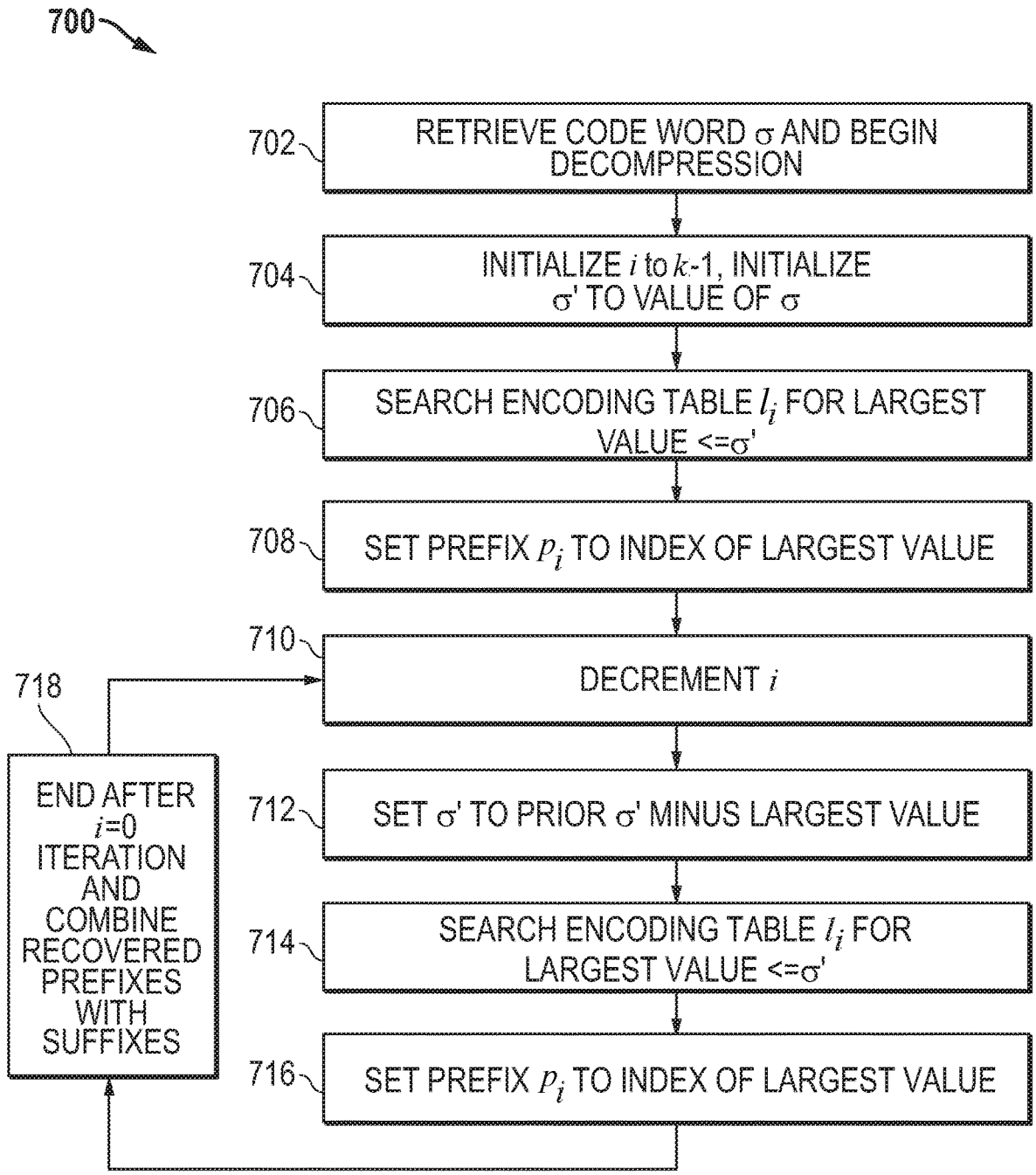
FIG. 7 illustrates in flow diagram form a process for decompressing a code word according to some embodiments.
Figure 9:
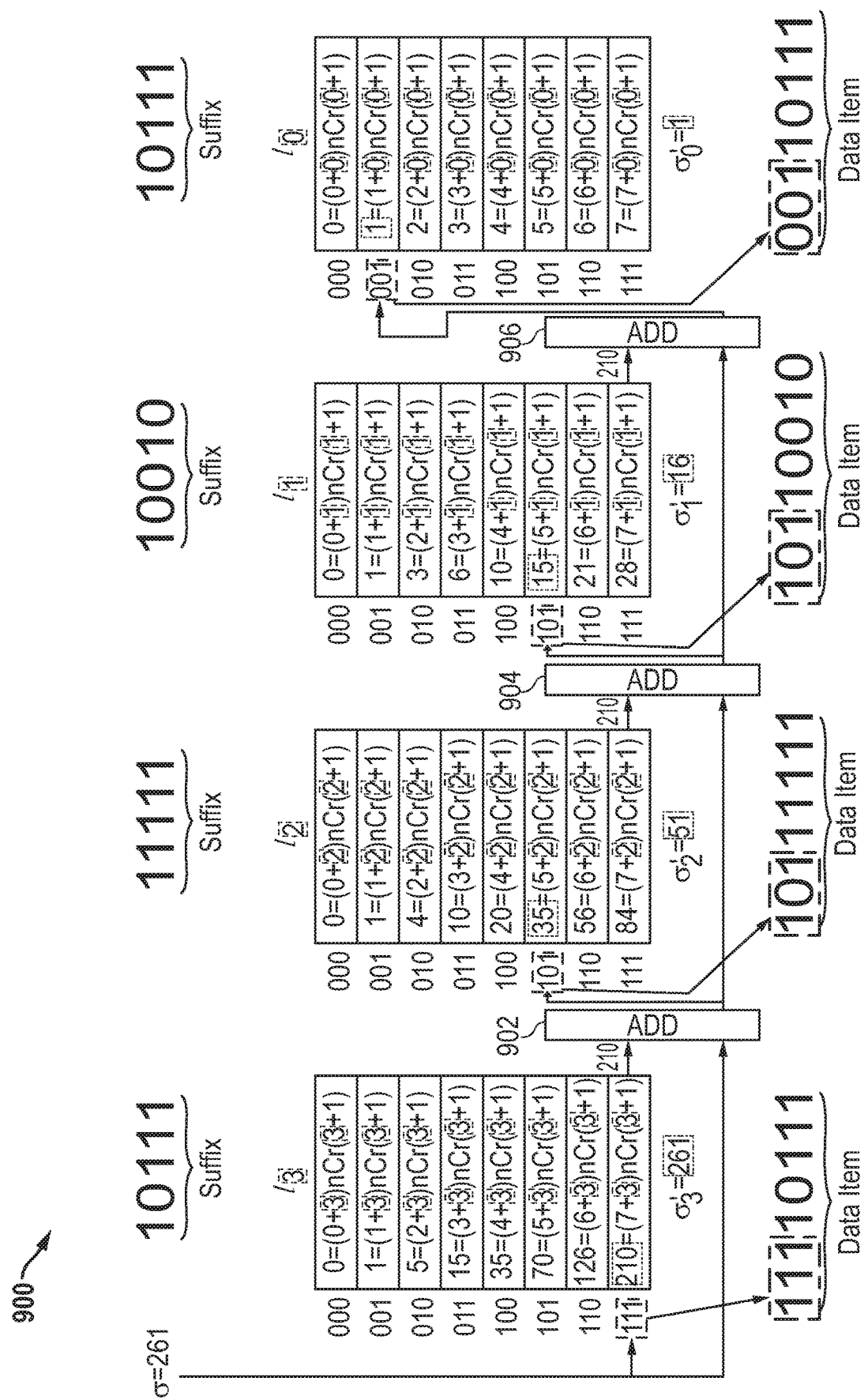
FIG. 9 illustrates in diagram form a further portion of the process of FIG. 8.

FIG. 7 illustrates in flow diagram form a process 700 for decompressing a code word according to some embodiments. FIG. 8 illustrates in diagram form part of a process 800 using encoding tables to decompress a code word according to some embodiments. FIG. 9 is a diagram showing a further portion 900 of the process of FIG. 8. The following description will refer to FIGS. 7-9 as needed. Process 700 may be performed by a software decompression engine 116 (FIG. 1), or other suitable hardware implementation. The depicted decoding process is one example that may be used given the encoding process described above. Other decoding schemes are possible for the encoding used above or other encodings.

At block 702, in response to a requirement to provide data from a set of data items, process 700 retrieves the code word σ for the set of data items from memory and begins decompression. The stored suffixes of the set of data items are retrieved as well, as shown along the top of FIG. 8. The decoding generally starts with the code word σ that is the compressed representation of k, r-bit prefixes, and decodes the prefixes starting from the k−1th prefix down to the 0th prefix. Process 700 includes k iterations, in this example four, one per prefix. The iterations employ encoding tables $l_3$ to $l_0$, as shown in FIGS. 8 and 9, in the order produced by the semi-sorting. In this embodiment, the tables used are the same encoding tables that were employed in encoding from table $l_{k-1}$ to table $l_0$.

For the first iteration, process 700 at block 704 initializes an integer i to be k−1 and a search value σ' to be equal to the code word σ. Then at block 706, searching encoding table $l_i$ for a largest value that is less than or equal to the search value σ'. This is illustrated in FIG. 8 where table $l_3$ is shown with the search result highlighted from the searching for the highest value less than σ' of 261, which is the value 210 found in the last entry.

This search result is used at block 708, which sets the recovered prefix $p_i$ equal to a table index of the largest value found in the search. In the example of FIG. 9, the recovered prefix is set to the index 111 of the last entry in table $l_3$. The recovered prefix value of 111 is combined with the stored suffix value 10111, in the order provided by the sort used when encoding the code word, providing the complete data item shown under table $l_3$.

Next at block 710, the integer i is decremented to proceed to the next iteration. At block 712, the search value σ' is set equal to the prior search value σ' minus the largest value found in the prior search iteration that was less than or equal to prior search value σ'. In the example of FIG. 9, this value is shown by the new search value $\sigma_2$' calculated as 261−210=51. The source of the values is shown by the arrows feeding into the addition block 902.

Then at block 714, the encoding table $l_i$ is searched for the largest value that is less than or equal to the new search value σ'. This is shown in FIG. 8 by the highlighted search result in table $l_2$ of 35, the largest table entry less than 51. At block 716, the recovered prefix $p_i$ is set equal to a table index of the largest value found in the search. In the example recovered prefix $p_2$ is set to the highlighted index value 101 for table $l_2$. This prefix is combined with the stored suffix data to provide the complete data item for prefix $p_2$, which is 10111111.

Blocks 710 through 716 are repeated until a final iteration is completed with integer i at zero, which completes the set of recovered prefixes. In the example of FIGS. 8-9, the final two iterations are depicted showing resulting values. Table $l_1$ is searched with a value $\sigma_1$' of a of 16, which equals the prior search value 51 from the prior iteration minus the largest value found, 35. The recovered index $p_1$ is set to the table index value found searching with 16, which is 101, the index of 15 from table $l_1$. Then table $l_0$ is searched with a value of $\sigma_0$' of 1, which equals the prior search value 16 minus the largest value previously found, 15. The recovered index $p_0$ is set to the table index value found searching with 1, which is 001, the index of the value 1 found in table $l_0$.

Note that while the depicted process 700 shows the prefix recovery or decompression occurring completely, this is not limiting, and the process may be only partially completed if values are only required from prefixes recovered early in the process.

The searches of blocks 706 and 714 may be done in a linear or parallel fashion for small tables or alternatively using another suitable search algorithm such as a modified binary search for larger ones. As discussed above, the process may be implemented with a microprocessor executing program code, with application specific digital logic, or with programmable logic.

Figure 10:
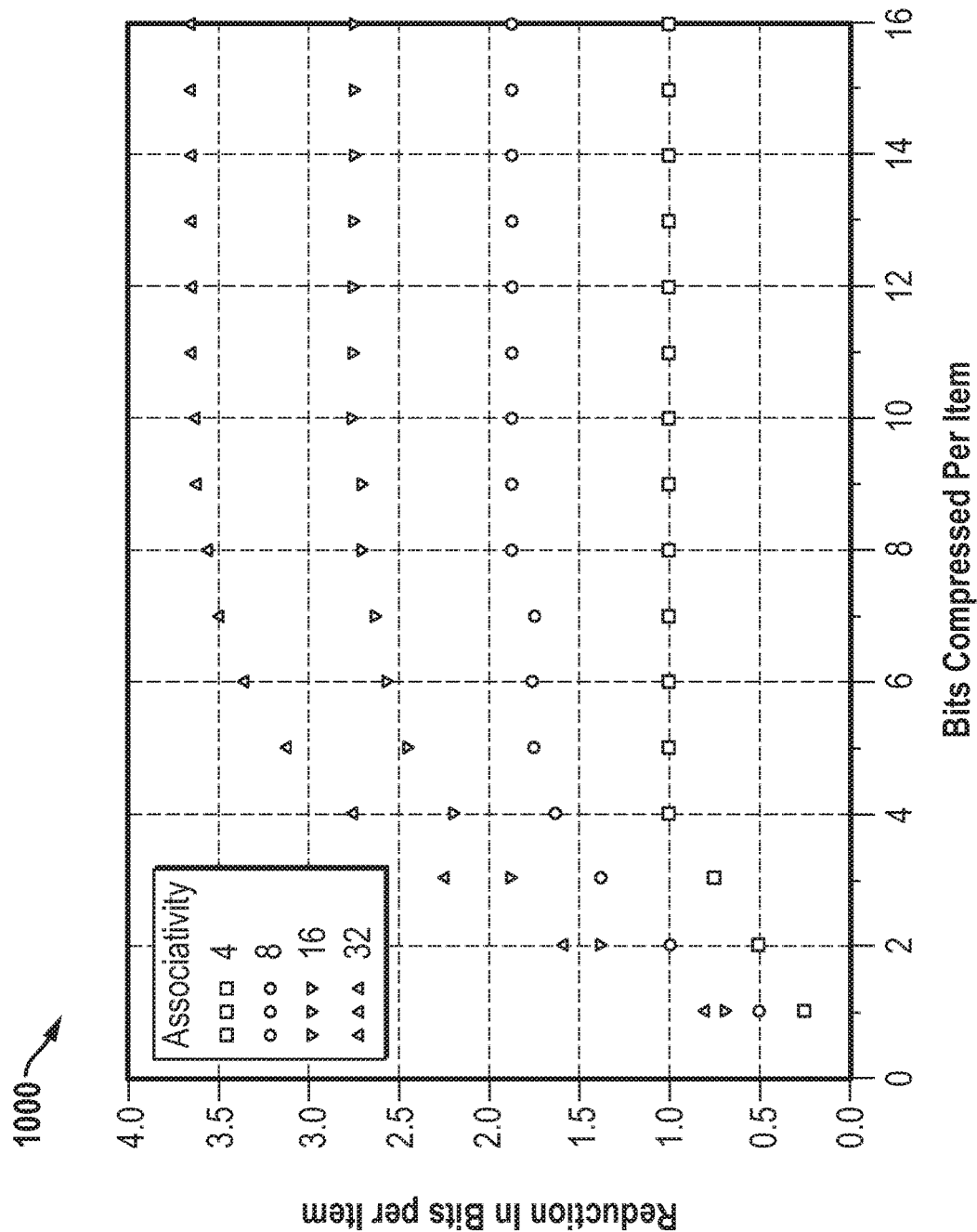
FIG. 10 illustrates in chart form an example of compression performance obtained according to some exemplary embodiments.

FIG. 10 illustrates in chart form an example of compression performance obtained according to some embodiments. Chart 1000 shows performance of the example process described above for multiple data sets, with the reduction in bits per data item on the vertical axis versus the prefix length in bits (r), the number of bits compressed per item, on the horizontal axis. The chart legend identifies the different associativities of the data sets. The term "associativity" is used herein as it is generally used in the art to describe cache sets or similar sets of data. That is, each memory address or other data item identifier maps to a possible number of positions within a set or group of data items. The number of possible positions is the associativity. Note that each power of 2 increase in associativity yields approximately another bit in savings per compressed prefix (assuming an appropriate value for r).

Given a k-item set with r-bit prefixes, the initial space to store those prefixes is kr bits. Such an encoding allows the storage process to encode all $2^{rk}$ permutations of a set of k, r-bit numbers where duplicates are permissible. However, with exactly $2^r$ distinct values per data item, if those values are ordered, the problem evolves from having to store all permutations of k r-bit numbers to only having to store the combinations. There are $$\binom{2^r + k - 1}{k}$$

such combinations, which is much less than the full $2^{rk}$ permutations. Thus, the techniques herein can encode those combinations in $$\left\lceil \log_2 \binom{2^r + k - 1}{k} \right\rceil$$

bits, when rounding up to the nearest whole bit. The net savings per set are therefore the net size of k, r-bit numbers (kr bits) minus the new size $$\left(\left\lceil \log_2 \binom{2^r + k - 1}{k} \right\rceil \text{bits}\right).$$

Dividing the net savings by the number of items per set (k), we get the savings in bits per compressed prefix (or item for that matter), which is plotted for several examples in FIG. 10 and generally described by Equation 2:

$$\text{Bits saved per } r\text{-bit prefix} = \frac{r*k - \left\lceil \log_2 \binom{2^r + k - 1}{k} \right\rceil}{k} \quad (2)$$

As can be understood from chart 1000, for high associativity structures, the storage cost of the prefixes can often be reduced by one to four bits depending on the set associativity. In ASMDSs, where data items are often only eight to a few tens of bits in length, the savings of one to four bits per item are significant. Further, the prefixes only need to be several bits in length to realize the bulk of the benefit of compression. This property is important because the individual encoding lookup tables in the example processes herein each have $2^r$ entries, so a longer prefix is costly in terms of the encoding table size.

Prior work uses one decoding table and one encoding table. If sorting is not performed prior to compression, then the full $2^{rk}$ permutations each need an entry in the encoding table. If sorting by prefix is performed prior to compression, then only a table with $$\binom{2^r + k - 1}{k}$$

entries is necessary. For example, if each entry is 4 bytes in size, then even with r=4 and k=4, there are 3867 entries in the lookup table. With two bytes per item, each table is about 8 KB (16 KB for both).

In contrast, some example implementations herein use k lookup tables, each with $2^r$ entries. With k=4 and r=4, such a design uses at most $k2^r$ entries. At two bytes per entry, the total space cost is 2 bytes*4*2^4=128 bytes. The storage cost of this approach scales roughly linearly with k when r is fixed but diverges from linear behavior because each lookup table entry takes on the order of $$\log_2 \binom{2^r + k - 1}{k}$$

bits to encode. Performing the encoding and decoding by computing the lookup table values on the fly further reduces the storage costs. As previously indicated, another available optimization is to make the final lookup table implicit because it is always $$\binom{p_0}{0+1},$$

which is simply $p_0$, so whatever is remaining after k−1 iterations of the decompression process is the last prefix. Similarly, during encoding, the final prefix of the encoding process may be encoded into the code word by adding the zeroth prefix to the integer sum (FIG. 3, 308).

Figure 11:
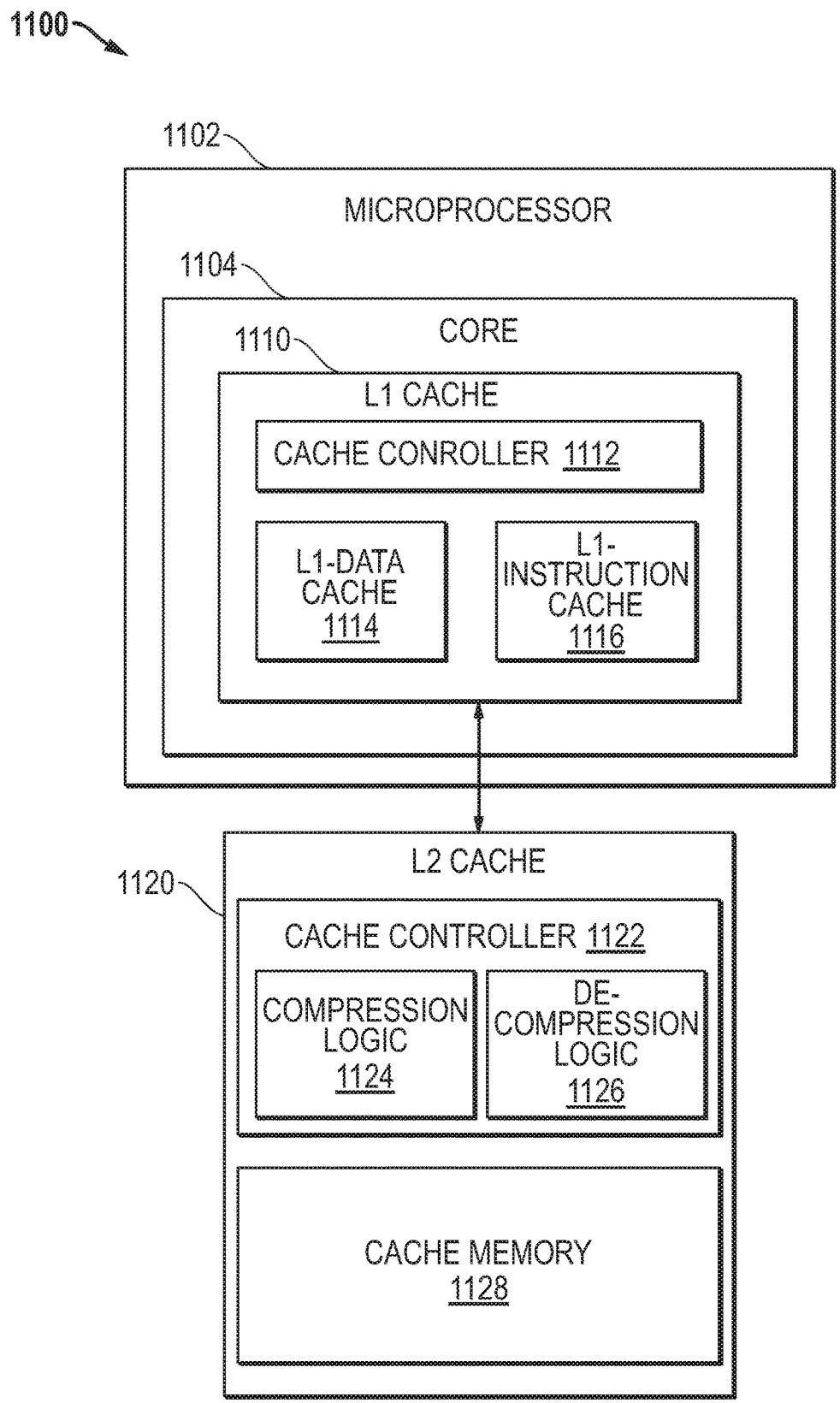
FIG. 11 illustrates in block diagram form part of a microprocessor cache system according to some embodiments.

FIG. 11 illustrates in block diagram form part of a microprocessor cache system 1100 according to some embodiments. A microprocessor 1102 has a processing core 1104 with an internal level-one (L1) cache 1110. L1 cache 1110 includes a cache controller 1112, an L1 data cache 1114, and an L1 instruction cache 1116. In this embodiment, the L1 cache does not employ the semi-sorting compression scheme herein, however in other embodiments an L1 cache may use such techniques if timing constraints of the processing core 1004's instruction pipeline permit. Only two cache levels associated with a single microprocessor core are shown for simplicity. L1 cache 1110 is connected to an external L2 cache 1120, which is typically external to processing core 1104 but located on the same chip. L2 cache 1120 includes a cache controller 1122, with compression logic 1124 and decompression logic 1126 for performing semi-sorting compression. Cache controller 1122 is connected to cache memory 1128 for storing cached data.

Further levels of caches may also be used, such as an L3 cache connected to the L2 cache, and an L4 cache. The depicted L2 cache preferably implements standard L2 functionality, that is responding to retrieval and storage requests from processing core 1004, but with improved storage efficiency over a traditional cache.

In operation, cache controller 1122 performs semi-sorting compression and decompression on a portion of the data stored in cache memory 1128. Cache controller 1122 employs the semi-sorting compression techniques discussed above with data items that are memory items stored in a tagged hardware structure. While a cache is described in this embodiment, a cache is merely one example of a tagged hardware structure that may implement the techniques herein. Any suitable tagged hardware structure including tags with associativity to a memory array may implement the techniques herein. For example, branch predictors are one suitable tagged hardware structure. Another example is hardware prefetchers that store state data in tagged arrays.

Figure 12:
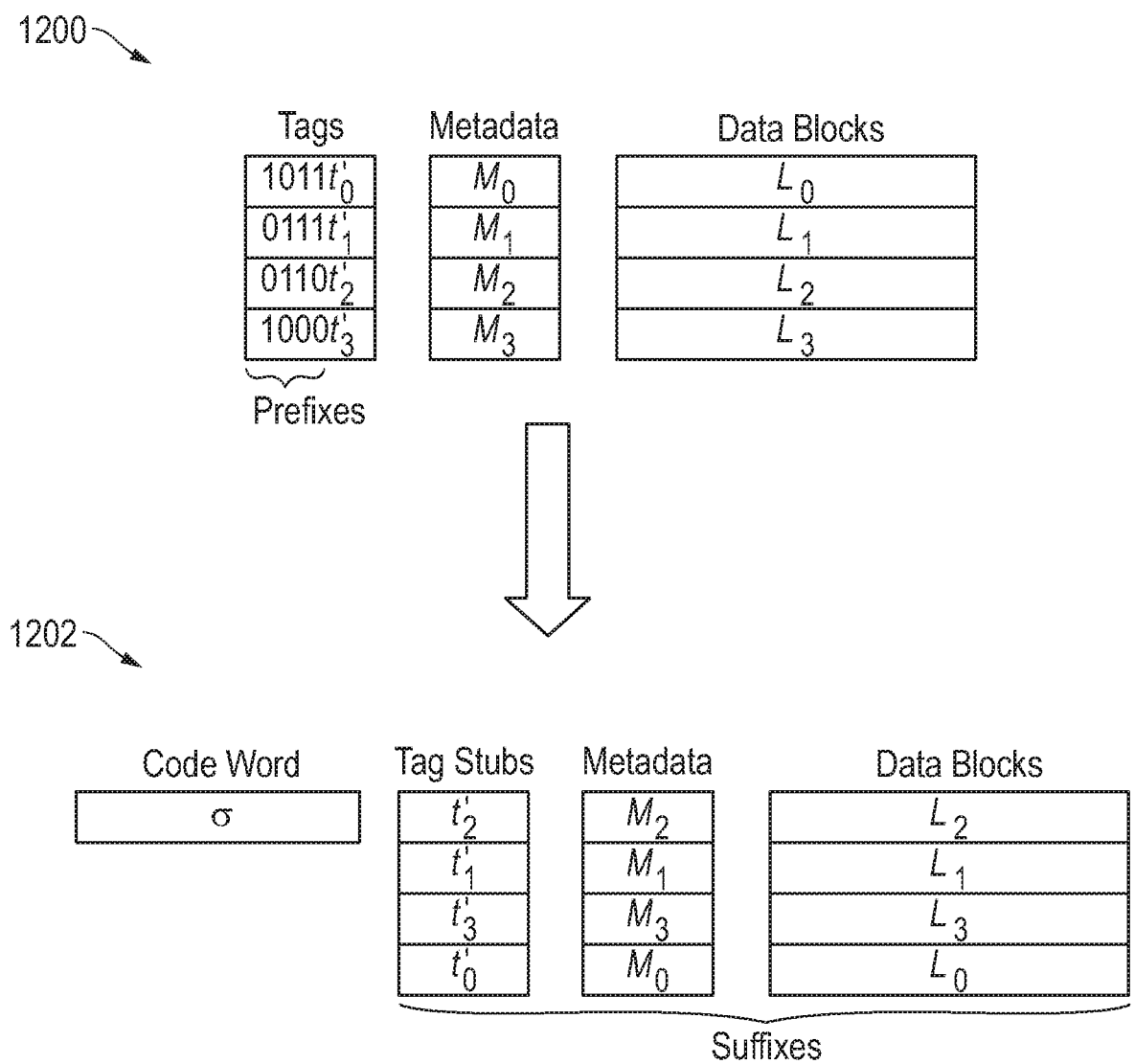
FIG. 12 illustrates a diagram of a process of using semi-sorting compression for memory items according to some embodiments.

FIG. 12 illustrates a diagram of a process of using semi-sorting compression for memory items 1200 according to some embodiments. A set of memory items 1200 is depicted in the upper part of the diagram in a form used in a traditional cache, while the same memory items are shown at 1202 in a form stored for a cache that employs semi-sorting compression of tags, such as L2 cache 1120. While the diagram shows an example of semi-sorting compression on a 4-way set-associative cache, generally the technique is better suited for higher associativity caches. The 4-way set-associative cache is shown for ease of explication.

The set of memory items 1200 on the top includes four memory items, each with a tag, metadata, and a line. The depicted arrangement of memory items 1200 represents a high-level baseline cache set design in which the Tags, Metadata, and Data Blocks are stored in an arbitrary order. The Tags are typical cache tags having a series of bits acting as a unique identifier for the memory item. In the example, Tags $t_0$, $t_1$, $t_2$, and $t_3$ have part of the tag data identified to be the prefixes 1011, 0111, 0110, 1000, for use in the application of semi-sorting compression. Inside the Tags, $t_0'$, $t_1'$, $t_2'$, and $t_3'$ correspond to the remaining suffix of each tag. The Tags $t_0$, $t_1$, $t_2$, and $t_3$ correspond respectively to lines $L_0$, $L_1$, $L_2$, and $L_3$, which hold the data to be cached, also known as blocks. The Metadata $M_0$, $M_1$, $M_2$, $M_3$ contains additional information regarding the memory item such as cache status information.

On the bottom of FIG. 12, an alternate arrangement is depicted with set of memory items 1202, including the same memory items in a different format. In memory items 1202, the prefixes are compressed for storage in the cache using semi-sorting compression such as that described above with respect to FIGS. 1-10, and replaced with a code word σ. Memory items 1202 are ordered according to the prefix values, from the lowest value prefix 0110 for $L_2$, to the highest value prefix 1011 for $L_0$. While the conventional cache arrangement of memory items 1200 permits arbitrary placement of cache lines into cache ways, the semi-sorted cache arrangement of memory items 1202 stores cache lines in cache ways subject to their prefix. The four prefixes are stored in compressed format as the code word σ while the Tag Stubs remain uncompressed and stored in a memory array. The code word σ and Tag Stubs may be stored at a higher level cache, or in the same cache holding the Data Blocks. In this example, the code word σ only takes 12 bits to store rather than the original 16, which saves 1 bit per tag.

Figure 13:
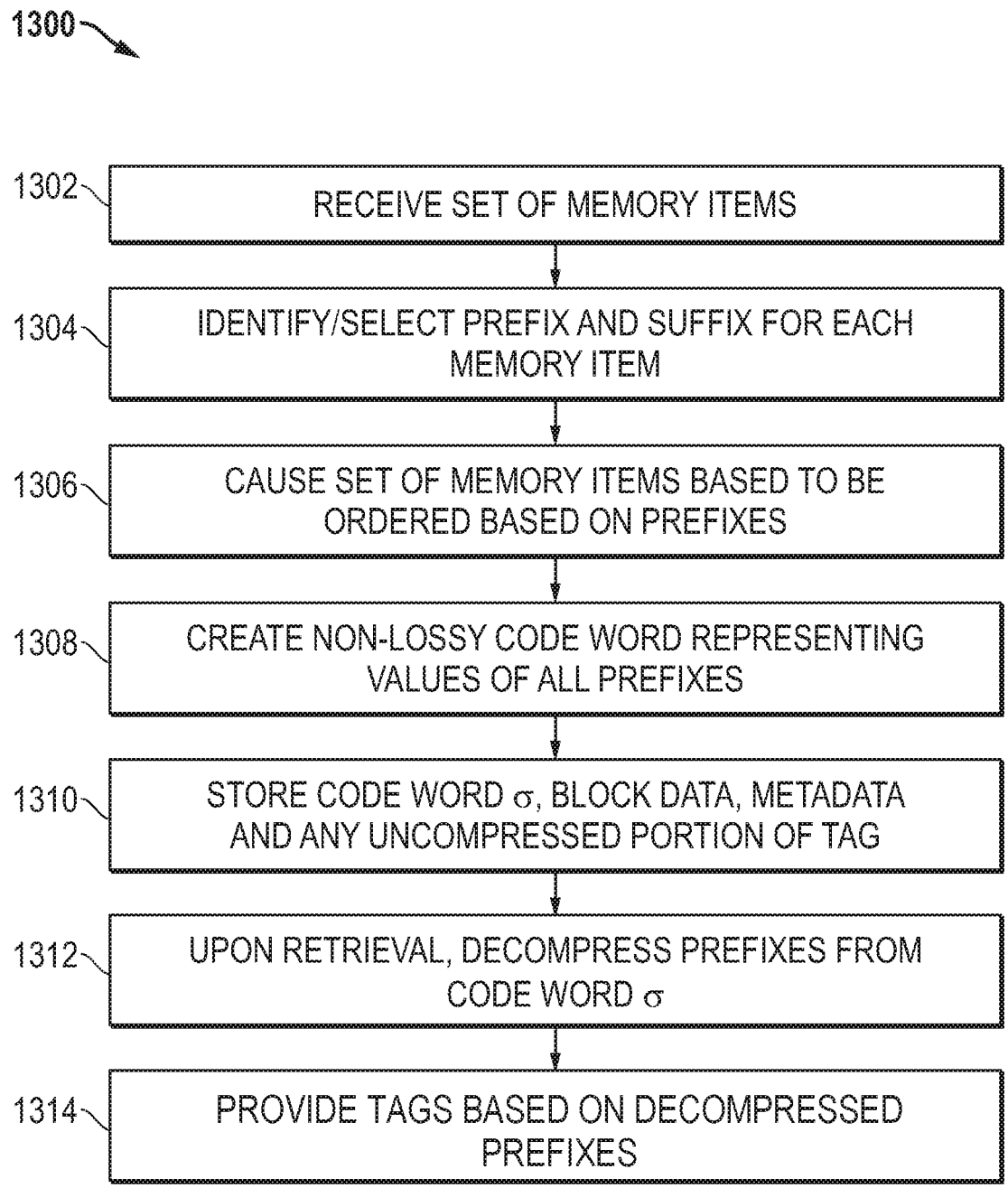
FIG. 13 illustrates in flow diagram form a process of storing and retrieving memory items according to some embodiments.

FIG. 13 illustrates in flow diagram form a process 1300 of storing and retrieving memory items according to some embodiments. The depicted process may be used, for example, in a cache system such as that of FIG. 11 or by a software cache arrangement such as that of FIG. 1. At block 1302, process 1300 receives a set of memory items, such as memory items 1200, for storage in a cache. The memory items may be received one at a time, in subsets, or the set may be received together. Typically, the memory items are received from a host processor core such as processing core 1104 (FIG. 11), but the memory items may be received from other sources as well, such as from a group of processing cores, a cache controller, or other types of memory controllers.

At block 1304, process 1300 either identifies or selects the prefix and suffix for each memory item. The prefixes are preferably a number of bits from the tag, as shown in FIG. 11. The prefixes may be created by selecting a deterministic subsequence of bits from each item, such as a number of initial bits. The subsequence may be selected from any desired part of the memory item and may include non-sequential bits from the memory item that are used directly or fed into a function that computes a fingerprint or hash. The suffix data is typically the bits remaining in the memory item excluding the prefix. For example, for the memory items 1202 (FIG. 12), the suffix includes the Tag Stubs, the Metadata, and the Data Blocks. In other embodiments, the suffix may include only the Tag Stub.

Next at block 1306, process 1300 causes the memory items to be ordered based on the prefixes. Block 1306 may include inserting memory items into the set in order of the prefixes. Or, the memory items may be sorted according to the prefixes. The suffix data may be stored in the appropriate memory location (e.g., the cache way) at this point or may be stored along with the code word after compression is completed. In some implementations of compression logic 1124 (FIG. 11), the compression logic may perform the ordering using a simple comparison circuit that compares one pair of prefixes at a time and which indicates the binary ordering of the pair. Furthermore, the ordering process does not necessarily require specialized hardware for sorting. The ordering operator could be as simple as a less than or equal comparison. From an unordered set, with a sufficient number of comparisons, a complete ordering of the memory items within the set can be achieved.

At block 1308, process 1300 creates a code word representing the compressed values of all the prefixes. The compression may proceed according to the process of FIG. 3, or according to any suitable compression process. As discussed above, the code word is created based on the sorted set. The code word is preferably non-lossy, that is, it is able to reproduce every bit of the compressed prefixes.

At block 1310, the code word and suffix data are stored in memory. The memory used for storage may be RAM memory such as cache memory 1128 (FIG. 11), or other suitable memory structures such as registers. For caching applications, the memory typically allocates sets of cache ways, which have designated locations for the Data Block, Metadata, and the Tag Stubs.

When information from the set of memory items is required to be accessed by the host system, the stored suffix data and code word are retrieved, and the prefixes are recovered by decompression at block 1312. An example of one suitable decompression process is described above. The recovered prefixes are then used to provide at least one of the tags at block 1314. If the prefixes include the entire tag, the recovered prefix value directly provides the tag. If tag stubs are used, the respective tag stub is paired with the tag stub to provide the respective tag. All of the tags may be recovered, or only one or more selected tags. The tags may then be employed in performing operations such as cache access operations.

Figure 14:
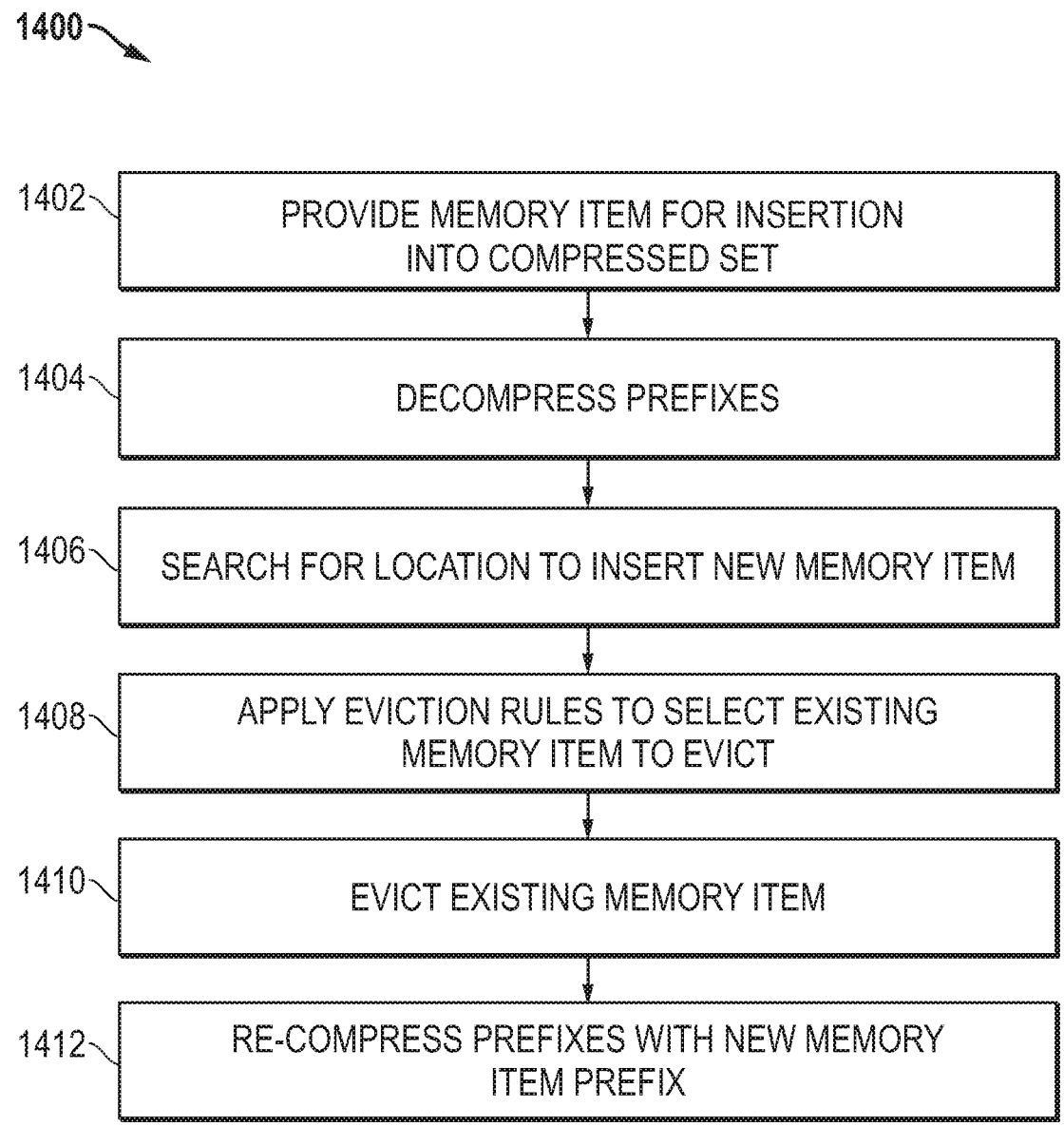
FIG. 14 illustrates in flow diagram form a process of adding a memory item to a set according to some embodiments.

FIG. 14 illustrates in flow diagram form a process 1400 of adding a memory item to a set according to some embodiments. FIGS. 15A-15D form a sequence of diagrams illustrating the process of FIG. 14. The depicted process may be performed by suitable cache hardware along with the semi-sorting techniques herein, for example by cache controller 1122 (FIG. 11), or by a software cache arrangement such as that of FIG. 1.

Figure 15A:
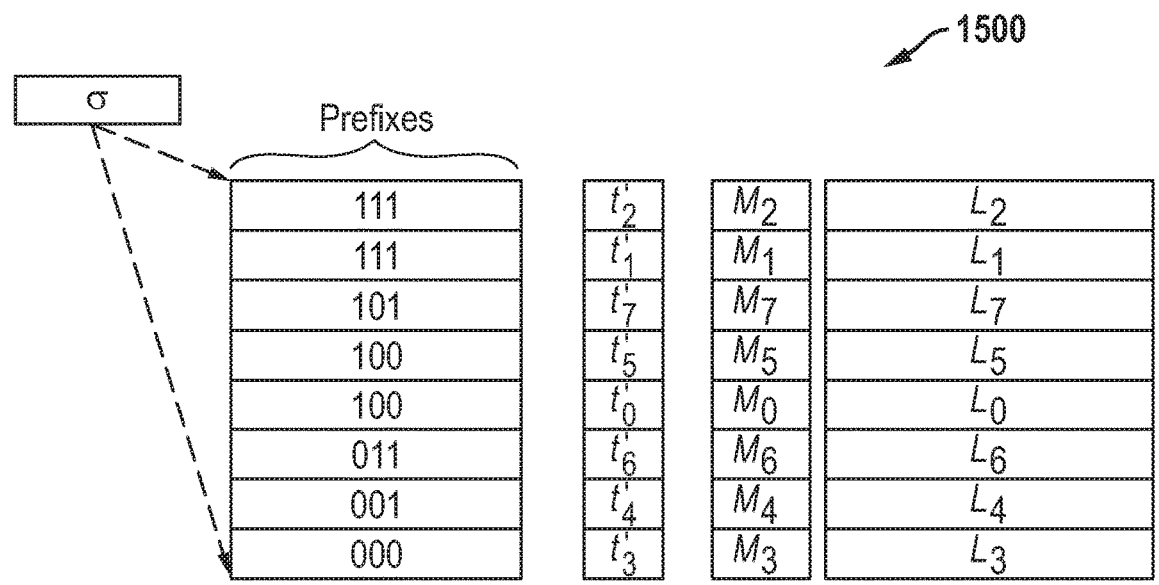
FIGS. 15A-15D form a sequence of diagrams illustrating the process of FIG. 14 according to some embodiments.
Figure 15B:
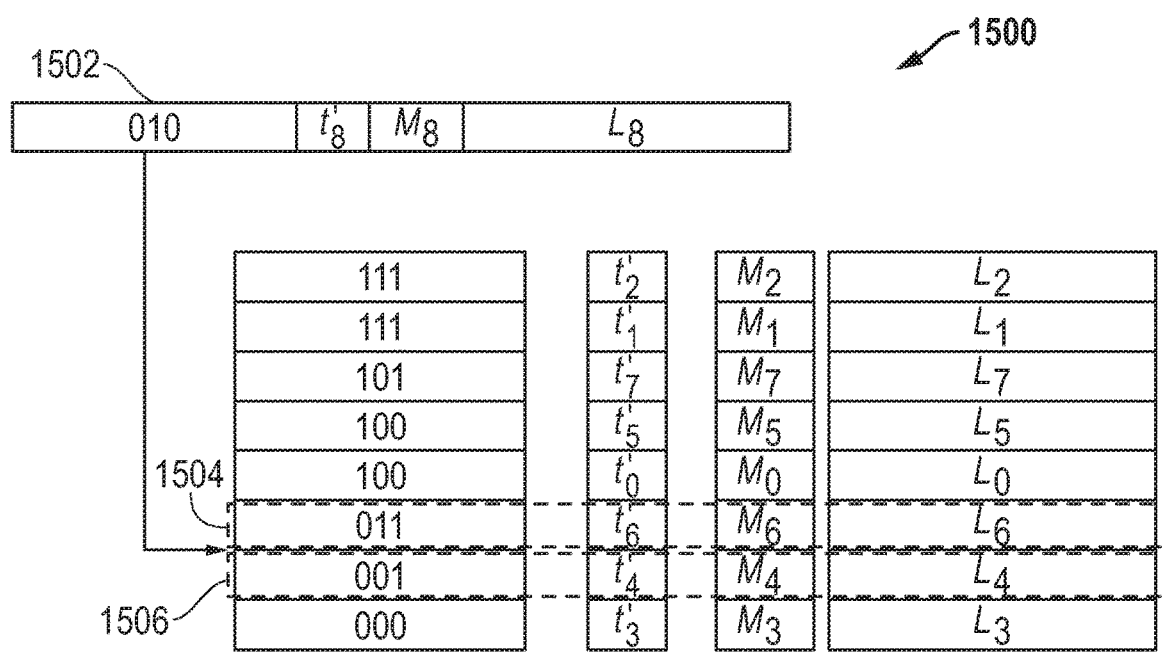

Process 1400 begins at block 1402, in which a new memory item is provided for insertion into the compressed set. New memory items may be provided when the set is being filled originally, or when the set is fully occupied and therefore items that are in the set are to be replaced. The new memory items are typically received at the cache controller from the host microprocessor or a related memory controller. FIG. 15B shows a new memory item 1502 received for insertion to a set of memory items 1500 in order. Due to the semi-sorting compression employed, new memory items are inserted into the set in order of their respective prefixes with the existing memory items.

In this embodiment, the process requires the prefixes of set 1500 to be in decompressed form for comparison. As shown at block 1404, the prefixes may be decompressed from the code word to provide the prefix values. FIG. 15A depicts a code word σ with arrows showing it is decompressed to provide the tag prefix values for set 1500. In this example, set 1500 includes eight memory items with the tag prefixes 7, 7, 5, 4, 4, 3, 1, and 0 (already appearing in sorted order from high to low). The tag prefixes are shown as binary numbers, the tag stubs are labelled $t_0'$-$t_7'$, the metadata are labelled $M_0$-$M_7$, and the data blocks are labelled $L_0$-$L_7$.

Block 1406 searches the prefix values for a location at which to insert the new memory item 1502. For each ordered set, when inserting a new memory item, there is typically a memory item with a tag prefix that is a numerical predecessor to the tag prefix of the new memory item, and another cache line whose tag prefix is a numerical successor. Block 1406 compares the tag prefix of new memory item 1502 to the tag prefixes of the memory items in set 1500 until the location of such predecessor and successor are found, or an identical tag prefix is found. In this example, the new memory item has a tag prefix of 2, and so the predecessor is memory item 1506 (FIG. 15B) with a tag prefix of 1, and the successor is memory item 1504 with a tag prefix of 3. The location at which new memory item 1502 may be inserted is indicated by the arrow. If the set of memory items 1500 is not full, new memory item 1502 may be inserted between memory items 1504 and 1506. This scenario is rare and only occurs soon after a cache is initialized or flushed. Similar behavior occurs when at least one cache line has been invalidated. In this case, an implementation can optionally decide to overwrite the invalid memory item without writing it back to the next level of cache or memory. Alternatively, it can fall back to the more typical scenario, which involves the insertion of a new memory item into a set of memory items that is full, like the depicted set 1500. In such case, a memory item must be selected to be evicted.

Block 1408 applies one or more eviction rules to select an existing memory item to evict. For the example, to insert new memory item 1502 with a tag with prefix of 2, process 1400 could either evict the cache line with the prefix of 1 (its predecessor) or 3 (its successor) without violating the non-numerically-decreasing ordering property of this specific implementation. Replacing 1 with 2 yields 7, 7, 5, 4, 4, 3, 2, 0 (a valid order for the compression process), and replacing 3 with 2 yields 7, 7, 5, 4, 4, 2, 1, 0 (also a valid order). Thus, there are two eviction options from which a final eviction 'victim' is chosen. The final selection can be done based on the choice of victim from a cache replacement policy. Block 1408 may use any suitable cache replacement policies such as the re-reference interval prediction (RRIP). Suitable policies may be determined by application, but may include known cache replacement policies such as Random, Least Recently Used (LRU), Tree Pseudo Least Recently Used (TreePLRU), Bimodal Insertion Policy (BIP), LRU Insertion Policy (LIP), Most Recently Used (MRU), Least Frequently Used (LFU), First-In, First-Out (FIFO), Second-Chance, Not Recently Used (NRU), RRIP, or Bimodal Re-Reference Interval Prediction (BRRIP), to name several examples. Future developed policies may also be applied with these techniques.

Whatever replacement policies are employed, the policies are applied by choosing from among fewer options to evict than such policies typically consider. In this example, the predecessor and successor memory items are the options for eviction. At block 1406, if one or more memory items are found with a tag prefix equal to the prefix of the inserted memory item, the eviction candidates may be only the matching memory items, or the matching memory items and the predecessor and successor memory items. For lower level hardware caches (e.g., L3 and beyond), in typical operating scenarios a large minority or even a majority of blocks are considered "dead" (i.e., have no further accesses before they would be evicted), so a reduction in the eviction choices likely has only a marginal effect on performance. Further, an applicable principle known as the power of k-choices dictates that choosing from among k≥2 choices is often enough to achieve good behavior. Note that for greater choice, the memory item set may be divided into two or more ordered subsets. For instance, the process 1400 may divide the set 7, 7, 5, 4, 4, 3, 1, 0 into the two subsets 7, 7, 4, 0 and 5, 4, 3, 1. In this case, 2 can replace either 4 or 0 in the first subset or the 3 or 1 in the second subset. Each subset would have its own compressed prefix.

Figure 15C:
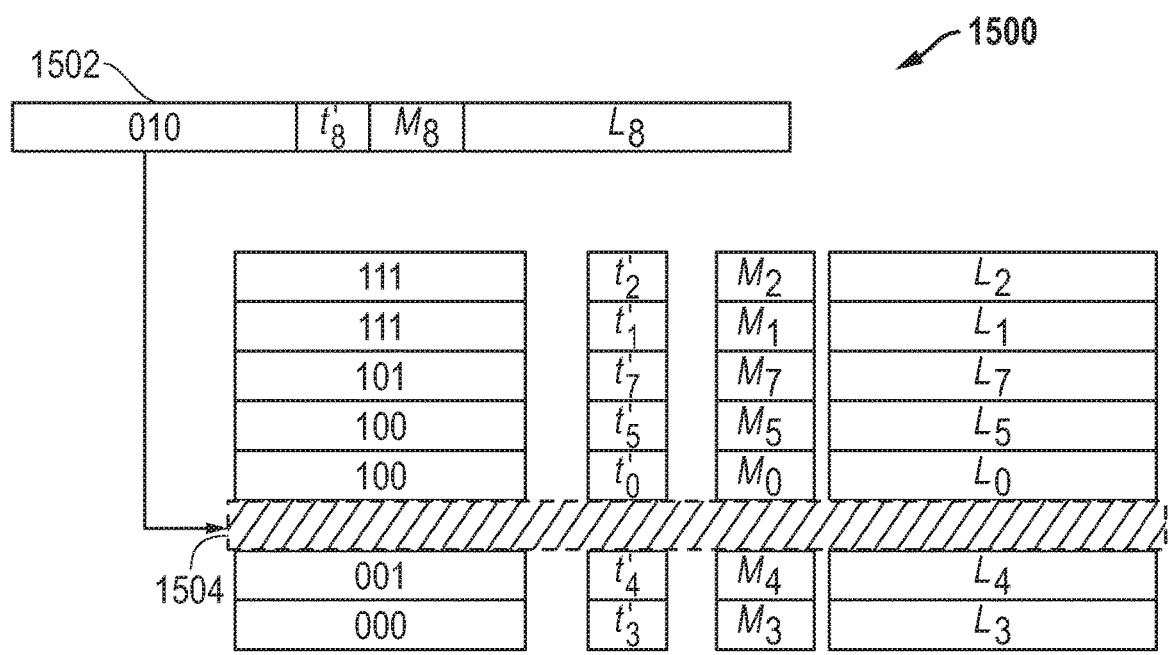
Figure 15D:
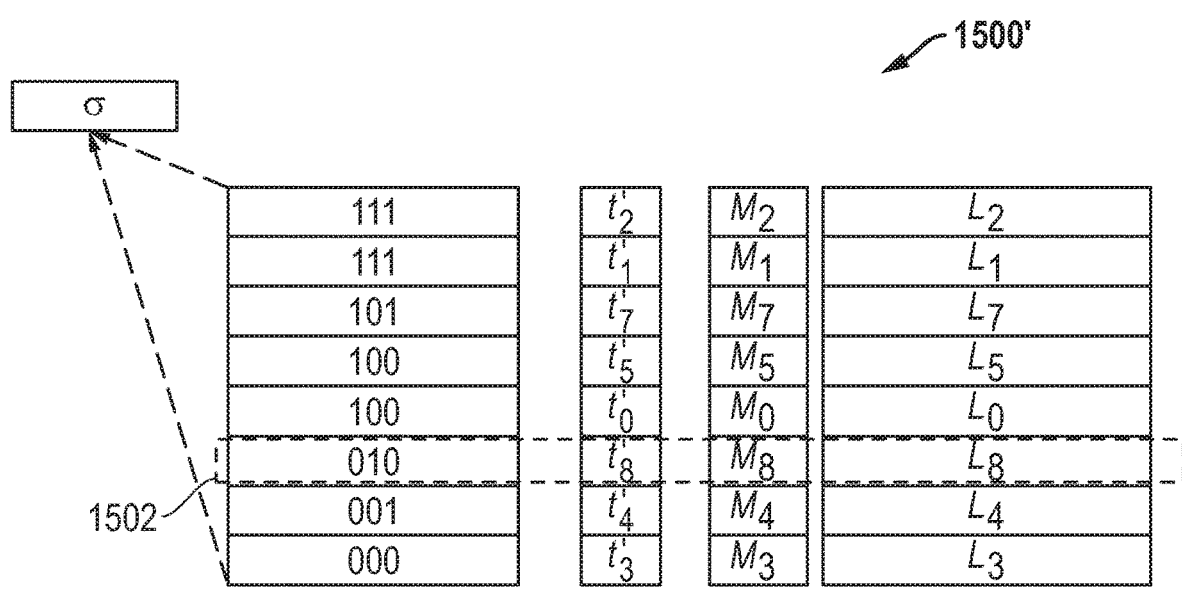

In the depicted example, the policies applied at block 1408 result in successor memory item 1504 being selected for eviction, as shown at FIG. 15C where memory item 1504 is crossed out. At block 1410, the memory item selected for eviction (1504) is evicted and replaced with new memory item 1502. This replacement is depicted in FIG. 15D where memory item 1502 is shown inserted into updated memory item set 1500'. The replacement is typically accomplished by overwriting the suffix data of the evicted memory item in the cache way with the new memory item and adding the prefix of the new memory item to the compressed code word. In this example, the old suffix data is overwritten with new tag stub $t_8'$, new metadata labelled $M_8$, and data block $L_8$.

At block 1412, the prefix of the new memory item 1502 is added to code word a, replacing the prefix of evicted memory item 1504. This replacement is typically done by re-compressing the entire code word with the new prefix value replacing the old.

As can be understood process 1400 may be implemented without having dedicated hardware for sorting cache lines within a set by tag prefixes. To sort a set of unordered tags, some embodiments may use a sorting network, which is efficient for sorting small numbers of items via comparisons. In this implementation, the replacement policies in the cache do not need to change but there is additional hardware or software logic required for sorting. In order to avoid pathological cases in which replacement among a subset of cache ways within a set may lead to poor performance, partial or full sorting of lines within a set may be triggered probabilistically in some implementations.

Figure 16:
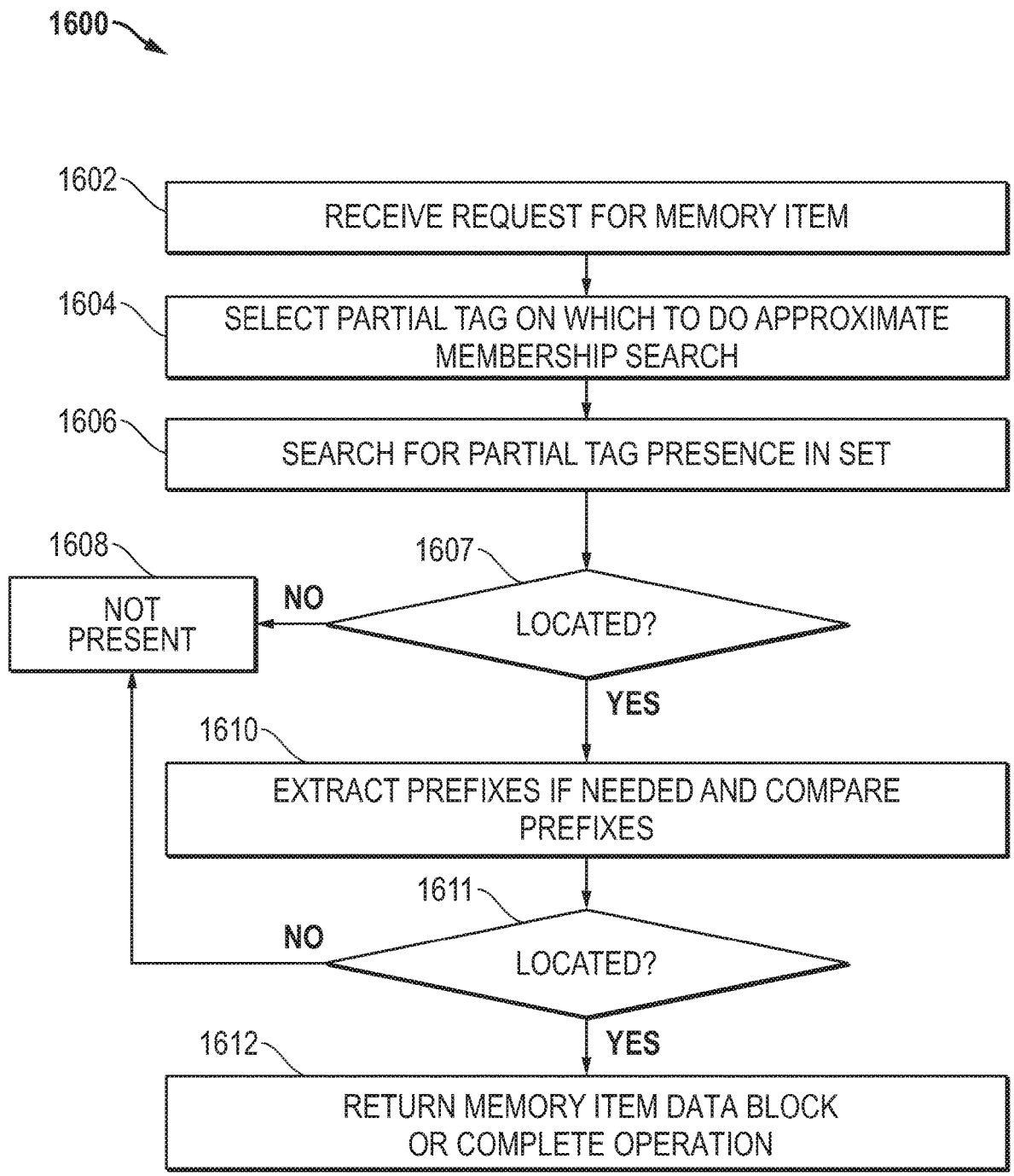
FIG. 16 illustrates in flow diagram form a process of checking if a memory item is present in a set according to some embodiments.

FIG. 16 illustrates in flow diagram form a process 1600 of checking if a memory item is present in a set according to some embodiments. Generally, process 1600 provides a way to accelerate the cache lookup process by optimizing for misses using a comparison of partial tags. The depicted process may be performed by a software cache arrangement such as that of FIG. 1, or suitable cache hardware along with the semi-sorting techniques herein, for example by compression cache controller 1122 (FIG. 11).

For caches employing the semi-sorting compression techniques herein without acceleration, cache lookups typically proceed as standard cache lookups, with an added decompression step. For determining whether a queried cache line is in a cache set, the software/hardware checks whether there is any valid cache line within the set whose tag matches the queried tag. Such an implementation proceeds by reconstituting the set of cache tags that correspond to valid lines and performing a full tag comparison. This reconstitution occurs by decompressing at least a minimal set of cache tag prefixes (those that correspond to valid lines), and checking for a match of bits within the tag to a target tag. Provided that no valid tags match, the request is forwarded one or more levels down in the memory hierarchy or hierarchy of software caches.

Process 1600 accelerates cache lookups by performing an approximate membership check for the presence of a memory item in the set by comparing a portion of one or more of the tags in the set to a corresponding portion of a tag for a desired memory item. While the full tag needs to be compared to determine whether a hit has occurred, often comparing only a small fragment of most tags is enough to rule them out as matches. These fragments are referred to as partial tags. Process 1600 compares partial tags from a set of memory items against a partial tag, and then only on a match of that partial tag, proceeds to performing the comparison on the full tag.

Figure 17A:
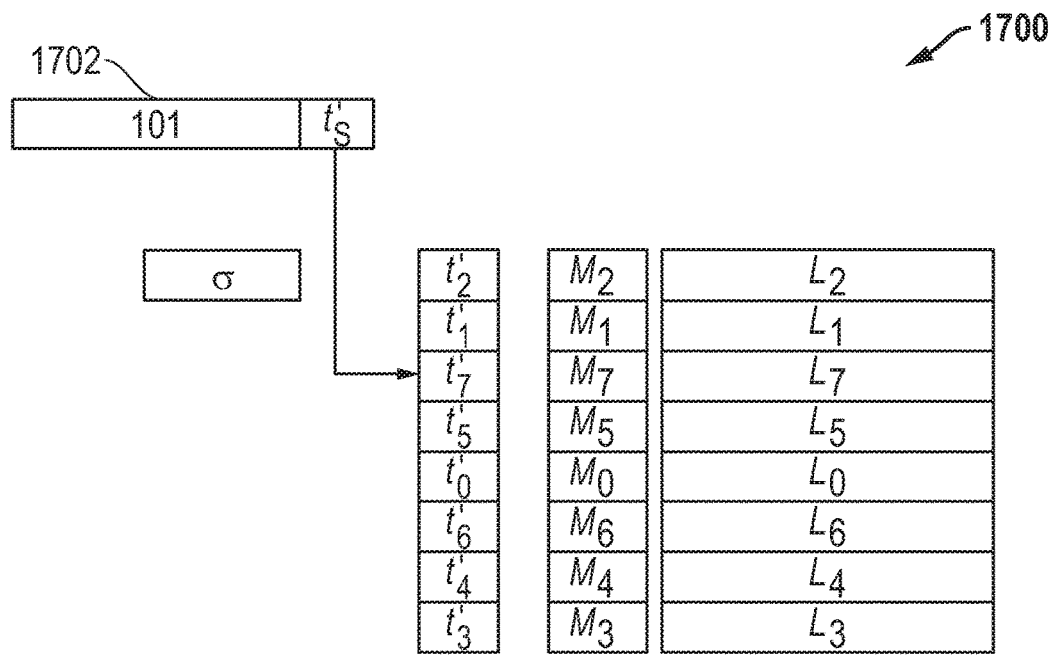
FIGS. 17A-17B form a sequence of diagrams illustrating the process of FIG. 16 in operation.
Figure 17B:
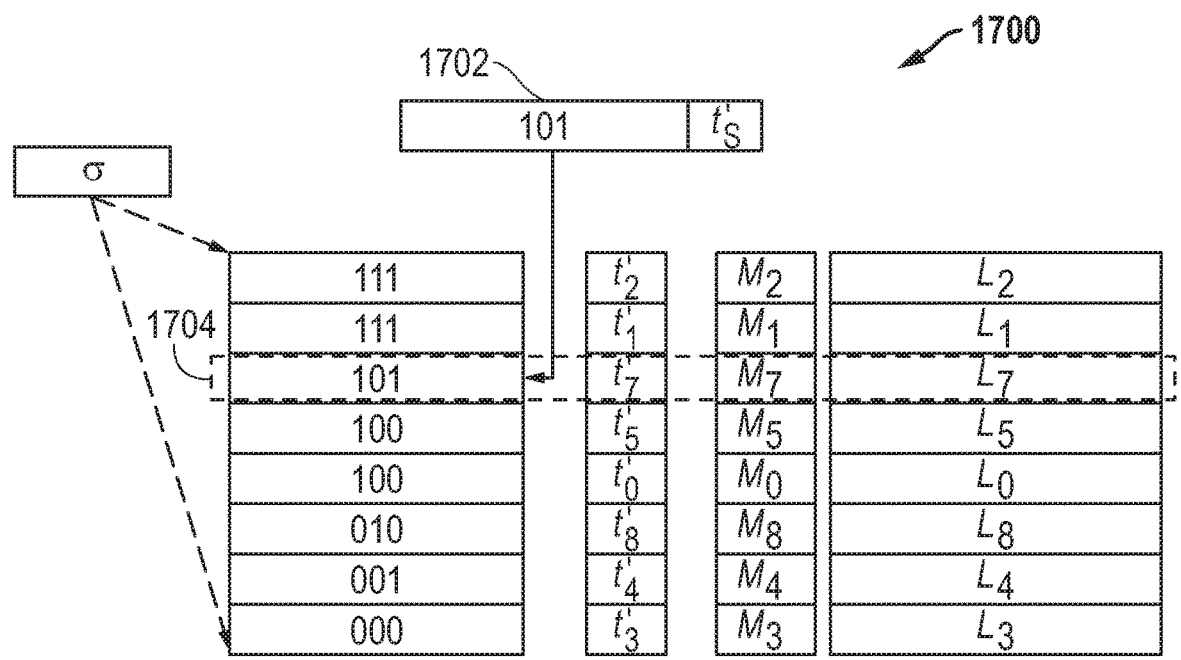

Process 1600 is further illustrated with respect to FIGS. 17A-17B, which form a sequence of diagrams illustrating process 1600 in operation. Referring to FIGS. 16 and 17A-17B, process 1600 begins at block 1602, where a request to retrieve a memory item is received with a tag 1702 for the desired item. Tag 1702 includes a prefix value of 101 and a tag stub labelled $t_S'$. The request is typically a cache access request received from the originating processor or a higher level of the host cache system.

Next, the partial tag with which to perform the check is selected from 1702 at block 1604. The partial tag used in this example is the full tag stub $t_S'$. In other embodiments, the partial tag may be different. For example, a subset of the bits of the tag stub may be used, the prefix may be used, or a subset of bits from both the prefix and tag stub may be used.

At block 1606, the partial tag is compared to the partial tags of memory items in the set 1700 to find any matches. In this embodiment, the partial tags are the uncompressed tag stubs $t_0'$-$t_7'$. Therefore, no decompression is needed of the prefix values in code word σ to perform the partial tag comparison of block 1606. If no match is located, at block 1607 process 1600 goes to block 1608 where it determines the desired memory item is not present in set 1700. At block 1608, there is no need to decompress the tag prefixes, and the access can be treated as a miss.

If one or more matches are located, the matches constitute only an approximate match for the searched tag 1702, because the complete tag has not yet been compared at block 1607. A partial match is depicted in FIG. 17A where the arrow shows tag stub $t_S'$ matching to tag stub $t_7'$. In such case, process 1600 goes to block 1610, where the prefixes of the tags located at block 1607 are decompressed from code word σ, and compared to the prefix of the searched tag 1702. If the prefix matches at block 1611, the lookup is successful, and the cache access is a hit. This scenario is depicted in FIG. 17B, where prefix 101 of tag 1702 is found to match the decompressed prefix of memory item 1704. In such case, process 1600 goes to block 1612 where at least part of the complete memory item is returned responsive to the access request, or a desired operation specified in the request completes on the requested cache line (e.g., load, store, invalidate). If there is no matching prefix at block 1611, the process goes to block 1608 where it is determined the desired item is not present. At this point the cache access is a miss, and the request is typically directed deeper into the memory hierarchy, to the next lower level of cache or memory.

A benefit of partial tag comparisons is that they can often reduce the latency and energy associated with cache accesses if misses are prevalent (which is the typical case for accesses to CPU L2 and L3 caches and in certain software caching applications). For misses, comparing against several bits of the tag is frequently enough to rule out a match on the full tag. Partial comparisons are sufficient on misses because if a subset of the bits of a tag do not match the queried tag, then neither can the queried tag.

While in this embodiment, the partial tag comparison is performed on the tag stubs, other embodiments may perform a different comparison. In some other embodiments, the initial partial tag comparison is performed on the tag prefixes. Accordingly, this approach may begin by first decompressing all or a subset of the tag prefixes from the code word associated with the set. A subset may be decompressed, for example, when possible with way prediction is used to narrow down possible matches, or when invalid lines are present that can be ignored. Upon any match of the prefix, the rest of the tag is compared. If it is also a match, then the operation proceeds as a hit. Otherwise, the operation proceeds as a miss. This approach may be useful in certain software caching applications in which the partial tags may be stored in a separate partial tag table to improve the mean access latency due to improved cacheability. The additional decompression latency may be acceptable if it is able to be performed off of the critical path of execution. Co-routines, software pipelining, and asynchronous memory access chaining may be used to hide or amortize this latency. Furthermore, the search for matches may have improved speed because the prefixes are sorted.

In some additional embodiments, each tag is divided into two or more partial tags, where one of the partial tags contains both the compressed prefix and some additional bits from the tag stub. The comparison first proceeds on the first partial tag, and then, only on a match, proceeds to the other partial tag. Note that the initial comparison on the first part may first proceed by doing a partial comparison on the additional bits from the tag stub, and then provided that they match, then move on to decompressing all or the relevant prefixes. If none of the first partial tags match, then the access is a miss. If one or more first parts match, then the subsequent portions of the tag also need to be compared to determine if the access is a true hit. At each independent partial comparison, if not match it found, it is safe to treat the access as a miss and skip comparing against the next partial tag. Such an approach may yield speed or size advantages by reducing the number of bits compared for accesses that are misses.

Depending on the application, there are a number of considerations when determining which arrangement to use for the partial tag to improve overall system efficiency when ruling out hits with partial tag comparisons. Because the semi-sorting compression techniques herein are most advantageous on high-entropy bit sequences (which are often the lower order bits of the tag), the lower order bits of the tag are likely the preferred bits to use as a prefix since other techniques would likely fail to compress the lower order bits efficiently. However, those same portions of the tag are also the most efficacious at filtering out misses, as they are likely to differ to the greatest degree between tags within a set. Thus, there are advantages to using partial tags that contain the tag prefixes. However, the latency of decompressing the partial tag may not be fully hidden off of the critical path. Therefore, it is advantageous to include several bits of the tag stub in the partial tag to avoid needing to decompress partial tags on most true misses.

Depending on the application, there will be different thresholds for the tolerable latency when accessing the tag and completing the comparison. For instance, at the L1 cache, the decompression latency likely needs to be entirely hidden from the critical path. However, at the L2 and L3, it may be acceptable for the decompression to take several cycles if the net effect is that the mean cache and memory access latency is reduced. The L2 and L3 may thus be able to employ the tag prefix as the partial tag, with little difference in performance from the embodiments that use two or more partial tags.

Performance may be particularly improved when a tag is split into partial tags stored in multiple tag arrays. An initial partial comparison is performed on a first tag array, and only upon a match does it become necessary to compare to the rest of the tag. Another feature may be beneficial with such an arrangement is to store an array of compressed partial tags closer to the processor than the host cache, and use that array to quickly direct misses on the partial tag to a lower level in the memory hierarchy, thereby potentially bypassing a cache level in its entirety. For example, if the partial tags from the L3 are stored in or near the L2, then if none of the partial tags from the L3 match, then the L3 can be bypassed entirely, and one can go straight to the L4 (if it exists) or memory. The storage cost of enabling this bypassing is significantly reduced if the partial tags are short (e.g., 8 bits in length), the L3 has high associativity, and the partial tag includes some or all of the prefix bits.

Due to the ordering of cache lines by prefix, a binary/ternary search can be used to locate the set of cache lines that have matching prefixes. However, due to the comparatively poor locality of binary search, other methods such as sequential scans or parallel search are likely preferred implementations.

To combat latency, some implementations can proceed speculatively on a partial match. For example, if the initial partial tag comparison is performed on the tag stub and the tag stub matches, process 1600 can speculatively treat the access as a hit. The full tag comparison still needs to be performed, and if the tag does not fully match, then the speculative access is terminated as an incorrect state. For example, if the probability of an alias is sufficiently low (e.g., 1 in 1000), it may be acceptable to begin transferring a cache line on a partial match if the cost of reversing the incorrect computation is not too high (both in terms of implementation cost and its weighted impact on latency).

The techniques described herein may be implemented with various combinations of hardware and software. For example, the hardware circuitry may include digital logic, finite state machines, programmable logic arrays (PLAs), and the like. The compression and decompression processes could be implemented with a microcontroller executing stored program instructions to evaluate the relative timing eligibility of the pending commands. In this case, some of the instructions may be stored in a non-transitory computer memory or computer readable storage medium for execution by the microcontroller. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The data processing platform of FIG. 1, the data storage system of FIG. 11, or any portions thereof, such as processor 110, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the type of data in the data sets may vary in different embodiments, such as various types of cache lines, network routing data, or database entries. The mathematical algorithm used to produce the encoding tables may vary. The particular process for encoding and decoding based on the multiple tables may also vary. The method of providing the encoding tables may also vary, including calculation or partial calculation of the table values.

Accordingly, it is intended by the appended claims to cover all modifications of the disclosed embodiments that fall within the scope of the disclosure.

What is claimed is:

1. A data storage and retrieval system comprising:
   a memory;
   a digital logic circuit coupled to the memory and operable to:
   receive a set of memory items, the memory items each including a data block and a tag with a prefix comprising at least part of the tag;
   cause the set of memory items to be ordered based on the prefixes;
   create a code word containing compressed information representing values of the prefixes;

store the data block for each of the memory items and the code word in the memory;

decompress the code word to recover one or more of the prefixes; and provide at least one of the tags based at least in part on a respective one of the recovered prefixes.

2. The data storage and retrieval system of claim 1, wherein the digital logic circuit causes the set of memory items to be ordered based on the prefixes by inserting memory items into the set in order of the prefixes.

3. The data storage and retrieval system of claim 1, wherein the digital logic circuit causes the set of memory items to be ordered based on the prefixes by sorting the memory items according to the prefixes.

4. The data storage and retrieval system of claim 1, wherein the digital logic circuit is further operable to perform an approximate membership check for the presence of a memory item in the set by comparing a portion of one or more of the tags to a corresponding portion of a tag for a desired memory item.

5. The data storage and retrieval system of claim 4, wherein the compared portion is one or more uncompressed bits of the respective tag.

6. The data storage and retrieval system of claim 4, wherein the compared portion of the tags is the prefix.

7. The data storage and retrieval system of claim 1, wherein the digital logic circuit creates the code word by encoding the prefixes through querying a plurality of encoding tables including a number of prefix indexes to obtain a plurality of integers representing respective prefix indexes for the prefixes, and summing the plurality of integers.

8. The data storage and retrieval system of claim 1, wherein the digital logic circuit is further operable to:

receive a new memory item to be added to the set of memory items, the new memory item including a data block and a tag with a prefix comprising at least part of the tag;

determine a location within the set of memory items at which to insert the new memory item based on the prefix of the new memory item;

determine an existing one of the memory items to evict based as at least partially on the location; and evict the existing one of the memory items and insert the new memory item.

9. The data storage and retrieval system of claim 8, wherein the digital logic circuit is further operable to determine the existing one of the memory items to evict by applying a cache replacement policy to select one of a subset of the set of memory items surrounding the location.

10. The data storage and retrieval system of claim 1, wherein the digital logic circuit is embodied in a tagged hardware structure.

11. A method of compressing and storing data comprising:

receiving a set of memory items, the memory items each including data block and a tag with a prefix comprising at least part of the tag;

causing the set of memory items to be ordered based on the prefixes;

creating a code word containing compressed information representing values of the prefixes; and storing the data block for each of the memory items and the code word in a tagged hardware structure.

12. The method of claim 11, wherein causing the set of memory items to be ordered based on the prefixes includes inserting memory items into the set in an order of the prefixes.

13. The method of claim 11, further comprising performing an approximate membership check for the presence of a memory item in the set of memory items by comparing a portion of one or more of the tags to a corresponding portion of a tag for a desired memory item.

14. The method of claim 11, further comprising:

receiving a new memory item to be added to the set of memory items, the new memory item including a data block and a tag with a prefix comprising at least part of the tag;

determining a location within the set of memory items at which to insert the new memory item based on the prefix of the new memory item;

determining an existing one of the memory items to evict based as at least partially on the location; and evicting the existing one of the memory items and inserting the new memory item.

15. The method of claim 14, wherein determining the existing one of the memory items to evict is done by applying a cache replacement policy to select one of a subset of the set of memory items surrounding the location.

16. The method of claim 11, wherein creating the code word includes encoding the prefixes through querying a plurality of encoding tables including a number of prefix indices to obtain a plurality of integers representing respective prefix indexes for the prefixes, and summing the plurality of integers.

17. A method of decompressing stored data comprising:

retrieving a code word from a tagged hardware structure, the code word containing compressed information representing values of prefixes for each of a set of memory items, the memory items including data blocks stored in a sorted order according to the prefixes;

decompressing the code word to obtain the prefixes for each memory item in the sorted order; and based on the prefixes, providing a respective tag for each of the memory items, each prefix comprising at least part of the respective tag.

18. The method of claim 17, wherein the respective tags are provided by pairing the respective prefixes with a respective tag stub.

19. The method of claim 17, further comprising performing an approximate membership check for the presence of a memory item in the set of memory items by comparing a portion of the tags to a corresponding portion of a tag for a desired memory item.

20. The method of claim 17, wherein decompressing the code word includes reading entries from a plurality of encoding tables and performing computation on the entries to obtain values for the prefixes.

* * * * *